United States Patent
Masuda

[19]

[11] Patent Number: 6,103,564
[45] Date of Patent: Aug. 15, 2000

[54] METHOD FOR FORMING A DIODE IN A SURFACE LAYER OF AN SOI SUBSTRATE

[75] Inventor: Takashi Masuda, Tokorozawa, Japan

[73] Assignee: Citizen Watch Co., Ltd., Tokyo, Japan

[21] Appl. No.: 09/459,336

[22] Filed: Dec. 13, 1999

Related U.S. Application Data

[62] Division of application No. 09/280,689, Mar. 30, 1999.

[30] Foreign Application Priority Data

Apr. 1, 1998 [JP] Japan ..................... 10-88522

[51] Int. Cl.[7] ............................... H01L 21/8234
[52] U.S. Cl. ................... 438/237; 438/148; 438/311; 438/328; 257/347
[58] Field of Search ...................... 438/135, 136, 438/237, 328, 148; 257/347

[56] References Cited

PUBLICATIONS

S. Merchant, et al. "Realization of high breakdown voltage (>700) is SOI devices" IEEE International Symposium on Power Semiconductor device s and Integrated circuits, Apr. 22–24, 1991, pp. 31–35.

*Primary Examiner*—Charles Bowers
*Assistant Examiner*—Erik J Kielin
*Attorney, Agent, or Firm*—Armstrong, Westerman, Hattori, McLeland & Naughton

[57] ABSTRACT

A diode is formed by forming a PN junction region 6 with a p region 5 formed on a buried oxide film 19 side and an n region 7 formed on the surface side in a surface silicon layer 3 which is isolated by the buried oxide film 19 of an SOI substrate 1, providing a lightly doped p region 33 on one end side of the PN junction region 6 and a lightly doped n region 31 on an other end side, forming a heavily doped p region 13 and a heavily doped n region 9 at the respective surface portions of the lightly doped p region 33 and the lightly doped n region 31 in such a manner as not to contact the PN junction region 6, and providing two metal plates which respectively connect to the heavily doped p region 13 and the heavily doped n region 9.

2 Claims, 21 Drawing Sheets

F I G. 7
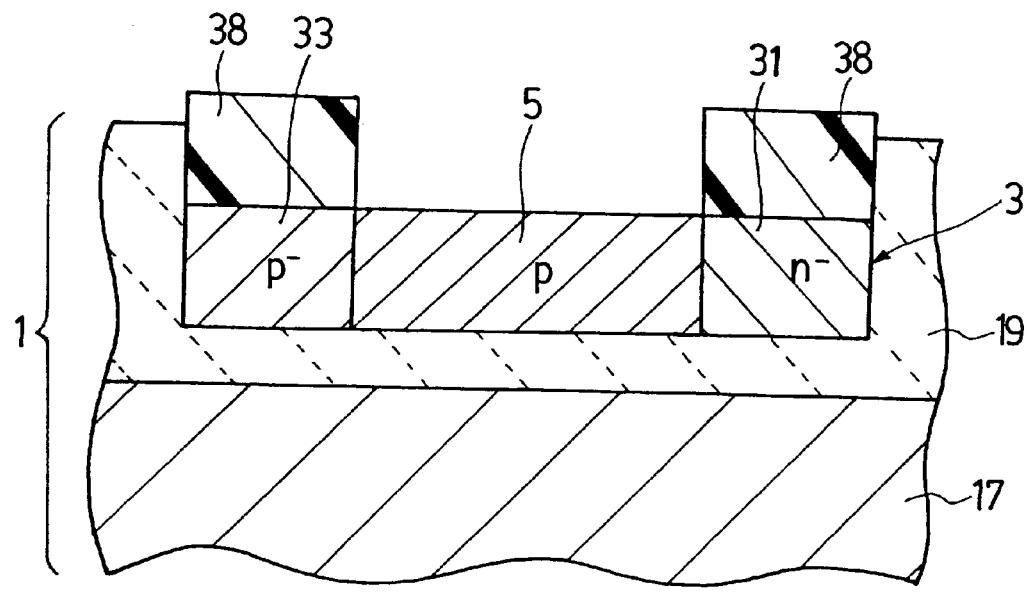
F I G. 8
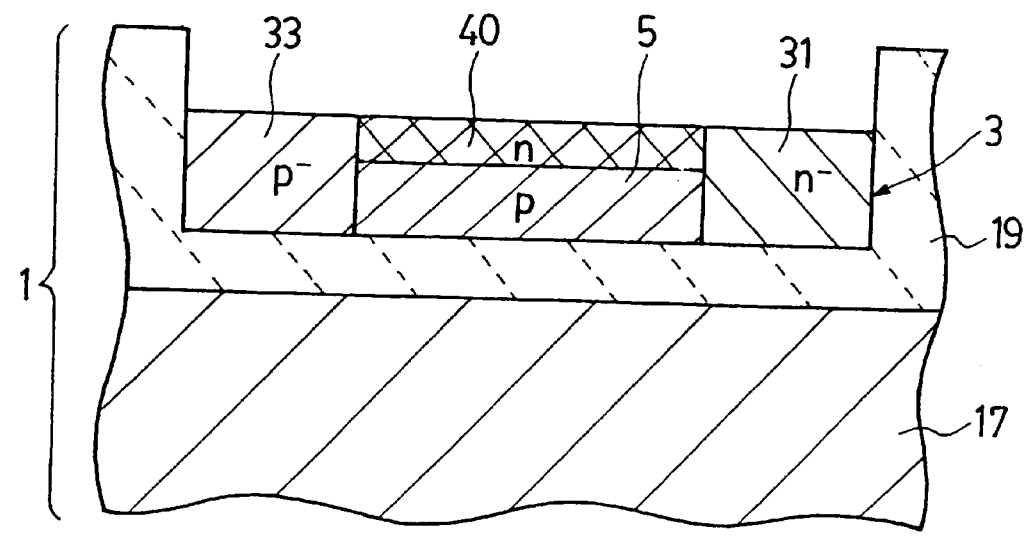

F I G. 1 1
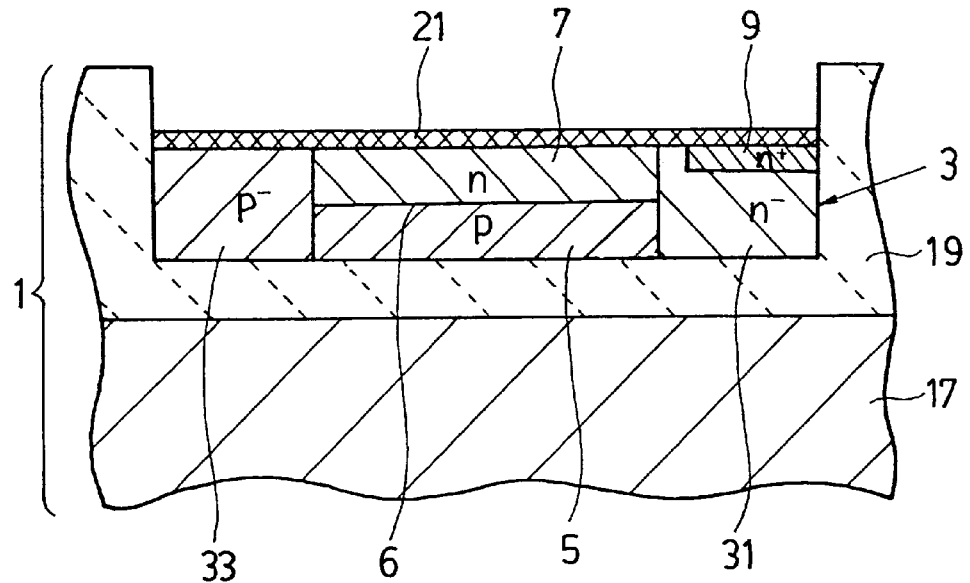
F I G. 1 2
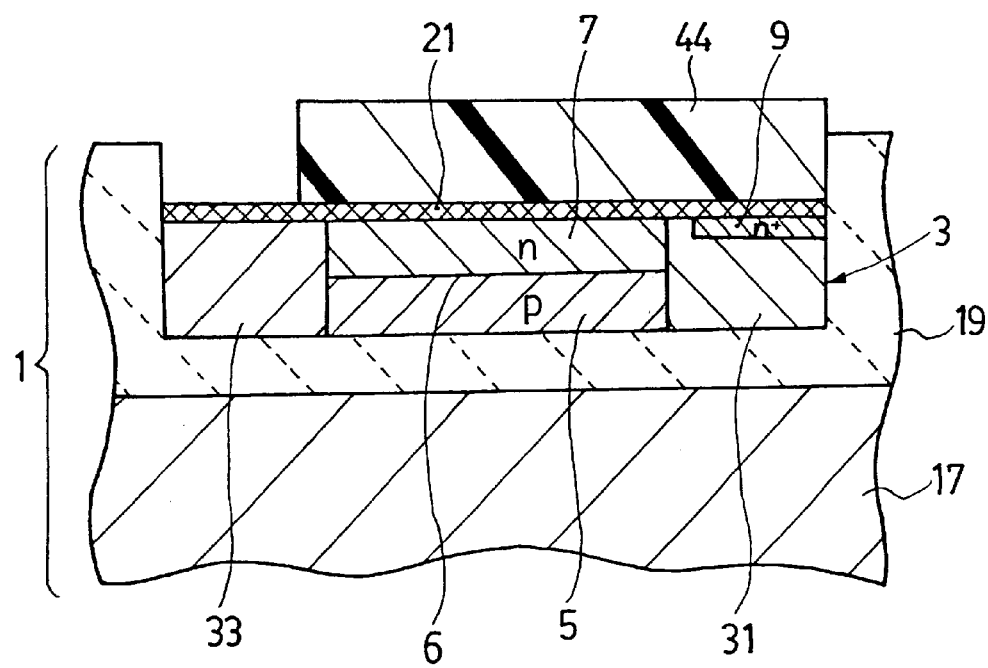

METHOD FOR FORMING A DIODE IN A SURFACE LAYER OF AN SOI SUBSTRATE

This application is a division of prior application Ser. No. 09/280,689 filed on Mar. 30, 1999.

BACKGROUND OF THE INVENTION

1. Field of the Invention

The present invention relates to a semiconductor device in which an SOI (Silicon On Insulator) substrate is used as a semiconductor substrate and a diode is formed in the surface silicon layer of the semiconductor substrate, and a method of fabricating the semiconductor device.

2. Description of the Related Art

In an SOI substrate, a plurality of surface silicon layers, which are isolated by a buried oxide film, are formed like islands on a silicon substrate.

It has been tried that semiconductor components such as transistors and diodes are formed in the surface silicon layers, using the SOI substrates, therewith a PN junction region of a semiconductor component can be completely isolated from other components, so it is expected that various problems caused by incomplete isolation can be solved.

As an example of the above semiconductor device, a semiconductor device in which a diode is formed in a surface silicon layer of an SOI substrate will be introduced hereinafter. FIG. 29 is a schematic sectional view showing the principal structure of the semiconductor device.

In the semiconductor device shown in FIG. 29, an SOI substrate 1 in which a plurality of surface silicon layers 3 isolated by a buried oxide film 19 are provided like islands (only one surface silicon layer is shown in the drawing) on a silicon substrate 17 which is a supporting substrate, and a diode 2 is formed in the surface silicon layer 3.

In the diode 2, a PN junction region with a p region 5 and an n region 7 is provided in the surface silicon layer 3, and a heavily doped p region 13 is provided at a portion on the surface side in the p region 5, and a heavily doped n region 9 is provided at a portion on the surface side in the n region 7 respectively.

A silicon oxide film 21 is provided to cover all the surface of the heavily doped n region 9, the n region 7, the p region 5, and the heavily doped p region 13, and furthermore an insulating film 23 is provided to cover the silicon oxide film 21.

Contact holes 12 and 14 are respectively formed in the silicon oxide film 21 and the insulating film 23 at locations corresponding to the heavily doped n region 9 and the heavily doped p region 13. From the outside through the contact holes 12 and 14, formed are metal plates 11 and 15 which electrically contact the heavily doped n region 9 and the heavily doped p region 13 respectively.

Next, a method of fabricating the semiconductor device will be explained with reference to FIG. 30 through FIG. 41. Each of the drawings is a schematic sectional view showing the fabricating process of the semiconductor device shown in FIG. 29 in due order.

First, the aforesaid SOI substrate 1 is prepared, and p impurities are ion-implanted into the surface silicon layer 3 which is isolated by the buried oxide film 19 to be provided like an island on a silicon substrate 17. Then, the implanted p impurities are diffused by heat-treating to form the p region 5 as shown in FIG. 30. Thereafter, the surface of the p region 5 is oxidized to form the silicon oxide film 21 on the whole surface of the surface silicon layer 3.

Sequentially, a photoresist is formed on the whole surface of the silicon oxide film 21 by spin coating and then is patterned, by exposing and developing with a predetermined photomask, so as to form a photoresist 22 in such a manner as to open a region where the n region is formed as shown in FIG. 31.

Then, using the photoresist 22 as an ion implantation barrier film, n impurities are ion-implanted into the p region 5 of the surface silicon layer 3 through the silicon oxide film 21. Thereafter, when the photoresist 22 is removed and then the implanted n impurities are diffused by heat-treating, the n region 7 is formed as shown in FIG. 32.

Next, a photoresist is formed again on the whole surface of the silicon oxide film 21 by spin coating and then is patterned, by exposing and developing with a predetermined photomask, so that a photoresist 24 is formed in such a manner as to open a region where the heavily doped n region is formed as shown in FIG. 33.

Then, using the photoresist 24 as an ion implantation barrier film, n impurities are ion-implanted into the n region 7 of the surface silicon layer 3 through the silicon oxide film 21, so that the heavily doped n region 9 shown in FIG. 34 is formed. Thereafter, the photoresist 24 shown in FIG. 33 is removed.

Thereafter, a photoresist is formed again on the whole surface of the silicon oxide film 21 by spin coating and then is patterned, by exposing and developing with a predetermined photomask, so that a photoresist 26 is formed in such a manner as to open a region where the heavily doped p region is formed as shown in FIG. 35.

Then, using the photoresist 26 as an ion implantation barrier film, p impurities are ion-implanted into the p region 5 of the surface silicon layer 3 through the silicon oxide film 21 to form the heavily doped p region 13 shown in FIG. 36. Thereafter, the photoresist 26 shown in FIG. 35 is removed.

Sequentially, as shown in FIG. 37, the insulating film 23 is formed to cover the whole surface of the silicon oxide film 21.

Thereafter, by heat-treating in a nitrogen atmosphere, the heavily doped n region 9 and the heavily doped p region 13 are electrically activated. It is noted that the heat-treatment in the nitrogen atmosphere serves as a reflowing treatment in which the uneven surface of the insulating film 23 is made flat.

Next, as shown in FIG. 38, a photoresist 28 is formed on the whole surface of the SOI substrate 1 by spin coating and then is patterned, by exposing and developing with a predetermined photomask, in such a manner as to provide openings 28a and 28b at locations over the insulating film 23 and the silicon oxide film 21 where the contact holes are formed.

Then using the photoresist 28 as a mask, the insulating film 23 and the silicon oxide film 21 under the openings 28a and 28b are completely removed by etching to form the contact holes 12 and 14 shown in FIG. 39. Thereafter, the photoresist 28 is removed.

Sequentially, as shown in FIG. 40, a film 30 made of metal plate material with aluminium is formed on the whole surface of the SOI substrate 1 and in the contact holes 12 and 14.

Next, a photoresist is formed on the whole surface of the film 30 of the metal plate material by spin coating and then is patterned, by exposing and developing with a predetermined photomask, in such a manner as to leave a photoresist 32 only on the regions where metal plates will be formed as shown in FIG. 41.

Then, using the photoresist 32 as a mask, the unmasked portion of the film 30 of the metal plate material is completely removed by etching to form the metal plates 11 and 15 shown in FIG. 29. The metal plate 11 electrically contacts to the heavily doped n region 9 and similarly, the metal plate 15 electrically contacts to the heavily doped p region 13, respectively. Thereafter, the photoresist 32 is removed, resulting in the completion of the semiconductor device in which the diode 2 shown in FIG. 29 is formed on the SOI substrate.

In the semiconductor device shown in FIG. 29 fabricated as above, the p region and the n region are formed in the surface silicon layer of the SOI substrate by an ion-implantation and a heat-treatment. The impurity profile, where the p region or the n region is formed in the silicon layer by the ion-implantation and the heat-treatment, generally shows a curved line indicating that the impurity concentration is the highest in the vicinity of the surface of the silicon layer.

Accordingly, in the diode 2 in the semiconductor device shown in FIG. 29, a surface junction region 3a located in the vicinity of the surface of the surface silicon layer 3 is the highest in impurity concentration in the PN junction surface which is formed with the p region 5 and the n region 7.

Generally, the PN junction, the higher the impurity concentration is, hard to spread the depletion layer and the junction breakdown voltage becomes low. Therefore, in the case of the diode 2 shown in FIG. 29, a breakdown occurs earliest at the surface junction region 3a in the surface silicon layer 3. When the breakdown occurs, carriers appear avalanche like in the depletion layer, and the carriers which have gained high energy there jump over an energy barrier to flow into the silicon oxide film 21. In the case of the diode 2 shown in FIG. 29, electrons are injected from the n region 7 in the vicinity of the surface junction region 3a into the silicon oxide film 21.

The carriers that are once injected into the silicon oxide film 21 are confined in the silicon oxide film 21, and are hard to be released therefrom to the outside. Therefore, electrons are captured in the silicon oxide film 21, which influences formation of a negative electric field in the direction from the surface of the n region 7 toward the silicon oxide film 21. With the influence of the electric field, the surface of the n region 7 changes to a state where electrons are ejected and are difficult to stay therein, so that the carrier concentration decreases in the vicinity of the surface of the n region 7. Thereby, the value of resistance per unit area in the surface portion (sheet resistance) becomes high and the current during forward bias becomes small.

If the PN junction is reverse-biased in a state where electrons are captured in the silicon oxide film 21, electrons are released from the surface of the n region 7 under the electric field which is formed with the electrons, resulting in a state where the depletion layer is more likely to spread out. Accordingly, the junction breakdown voltage comes to be high.

As described above, the diode has characteristics that once carriers are injected into the silicon oxide film, the current becomes small during forward bias and the junction breakdown voltage becomes high during reverse bias. The diode of the semiconductor device shown in FIG. 29 has a disadvantage that the device characteristics are varied by captured electrons in the silicon oxide film 21 when a breakdown occurs.

In other words, the diode which has been examined as the semiconductor device using the above SOI substrate has disadvantages that a breakdown occurs in the vicinity of the interface between the surface silicon layer 3 and the silicon oxide film 21, and the device characteristics are varied by the influence of carriers which flow into the silicon oxide film 21 with the breakdown, so that not only sufficient performance can not be obtained but also, at worst, a misoperation is caused in a circuit of which high accuracy is required.

SUMMARY OF THE INVENTION

The purpose of the present invention is to solve the aforesaid disadvantages so as to avoid variations in device characteristics even when a breakdown occurs in a semiconductor device in which a diode is formed in a surface silicon layer on the above SOI substrate and to fabricate the semiconductor device with efficiency.

The semiconductor device according to the present invention, in which a diode is formed in a surface silicon layer on an SOI substrate having a plurality of surface silicon layers isolated by a buried oxide film on a silicon substrate, has the diode structured as follows to achieve the above purposes.

More specifically, the aforesaid diode comprises: a PN junction region with a first conduction type region formed on a buried oxide film side of a surface silicon layer and a second conduction type region formed on the surface side; a first conduction type lightly doped region provided on one end side of the PN junction region and a second conduction type lightly doped region provided on the other end side; a first conduction type heavily doped region formed at the surface portion in the first conduction type lightly doped region; a second conduction type heavily doped region provided at the surface portion in the second conduction type lightly doped region; a metal plate contacting the first conduction type heavily doped region; and a metal plate contacting the second conduction type heavily doped region.

In this semiconductor device, since the PN junction region having a low junction breakdown voltage, formed with the first conduction type region and the second conduction type region both having high impurity concentrations, is formed inside the surface silicon layer, carriers are not injected into the silicon oxide film even when a breakdown occurs. Accordingly, variations in device characteristics caused by carriers injected in the silicon oxide film do not appear.

It is noted that in this semiconductor device, the second conduction type heavily doped region may be provided at the surface portion in the second conduction type region, instead of providing it at the surface portion in the second conduction type lightly doped region.

In these semiconductor devices, the aforesaid first conduction type region, the first conduction type lightly doped region and the first conduction type heavily doped region may be a p region, a lightly doped p region and a heavily doped p region respectively, and the aforesaid second conduction type region, the second conduction type lightly doped region and the second conduction type heavily doped region may be an n region, a lightly doped n region and a heavily doped n region respectively.

Alternatively, the aforesaid first conduction type region, the first conduction type lightly doped region and the first conduction type heavily doped region may be an n region, a lightly doped n region and a heavily doped n region respectively, and the aforesaid second conduction type region, the second conduction type lightly doped region and the second conduction type heavily doped region may be a p region, a lightly doped p region and a heavily doped p region respectively.

A method of fabricating a semiconductor device according to the present invention is one for fabricating the aforesaid semiconductor device in which the diode is formed in the surface silicon layer of the SOI substrate, and is characterized in that the process of fabricating the diode comprises the following steps;

a step of forming a first conduction type lightly doped region by selectively ion-implanting first conduction type impurity atoms into one end side of the surface silicon layer of the SOI substrate;

a step of forming a second conduction type lightly doped region by selectively ion-implanting second conduction type impurity atoms into the other end side of the surface silicon layer; and a step of diffusing impurity atoms in the first conduction type lightly doped region and the second conduction type lightly doped region by heat-treating.

Moreover, the process includes a step of forming a first conduction type region by selectively ion-implanting the first conduction type impurity atoms into the surface silicon layer between the first conduction type lightly doped region and the second conduction type lightly doped region; and a step of forming a PN junction region by selectively ion-implanting the second conduction type impurity atoms into the first conduction type region to a midpoint thereof in the thickness direction and then heat-treating to provide a second conduction type region on the first conduction type region.

Thereafter, the process includes a step of forming a silicon oxide film on the whole surface of the surface silicon layer by oxidizing in an oxidizing atmosphere;

a step of forming a first conduction type heavily doped region by selectively ion-implanting the first conduction type impurity atoms into a portion of the first conduction type lightly doped region which does not contact the second conduction type region; and a step of forming a second conduction type heavily doped region by selectively ion-implanting the second conduction type impurity atoms into a portion of the second conduction type lightly doped region which does not contact the second conduction type region.

Furthermore, the process includes a step of forming contact holes respectively at locations corresponding to the first conduction type heavily doped region and the second conduction type heavily doped region by photo-etching after forming an insulating film on the whole surface of the surface silicon layer; and a step of forming a metal plate contacting the first conduction type heavily doped region and a metal plate contacting the second conduction type heavily doped region through the respective contact holes.

In the method of fabricating the semiconductor device, the step of forming the aforesaid second conduction type heavily doped region may be replaced with the step of forming the second conduction type heavily doped region by selectively ion-implanting the second conduction type impurity atoms into a portion of the aforesaid second conduction type region.

The above and other objects, features and advantages of the invention will be apparent from the following detailed description that is to be read in conjunction with the accompanying drawings.

BRIEF DESCRIPTION OF THE DRAWINGS

FIG. 2 to FIG. 18 are schematic sectional views, similar to FIG. 1, showing the steps in due order for explaining a method of fabricating the semiconductor device shown in FIG. 1;

DETAILED DESCRIPTION OF THE PREFERRED EMBODIMENTS

Embodiments for realizing a semiconductor device according to the present invention and a method of fabricating the same will be described hereinafter with reference to accompanying drawings.

Figure 1:
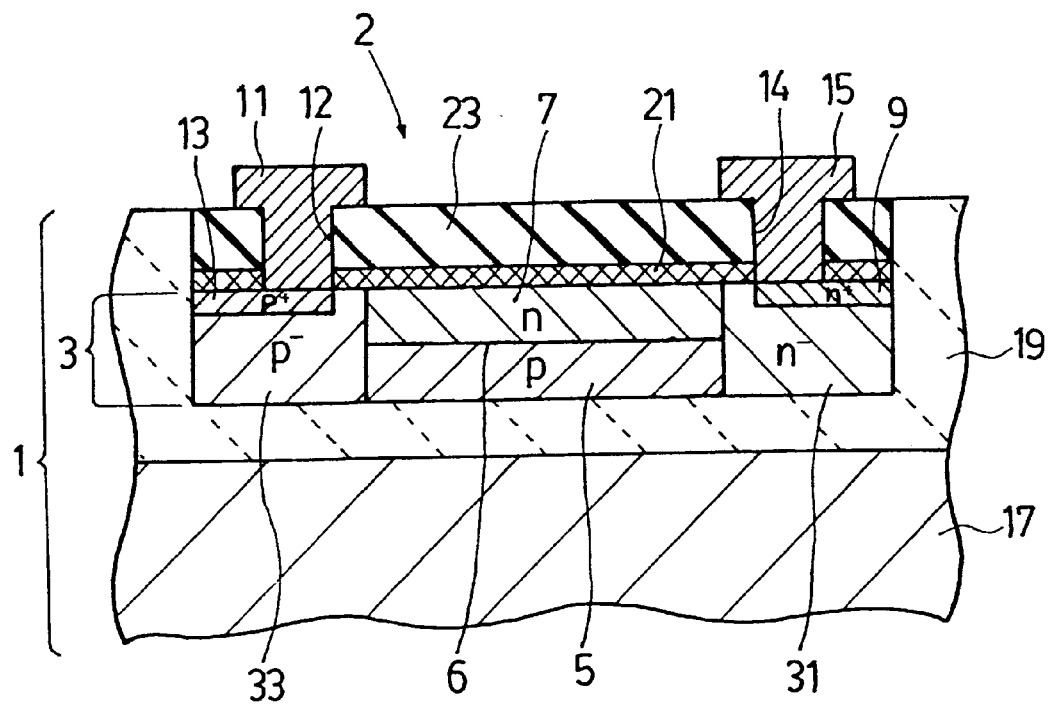
FIG. 1 is a schematic sectional view showing the structure of a principal portion of the first embodiment of a semiconductor device according to the present invention.

First Embodiment of a Semiconductor Device: FIG. 1

Figure 29:
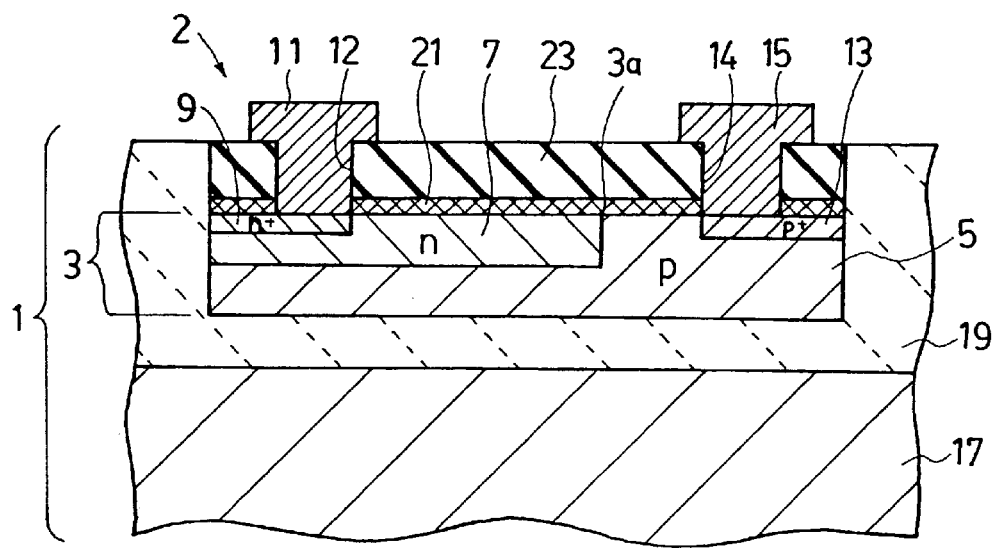
FIG. 29 is a schematic sectional view showing the structure of a principal portion of a semiconductor device in which a diode is formed on an SOI substrate relating to the present invention.
Figure 30:
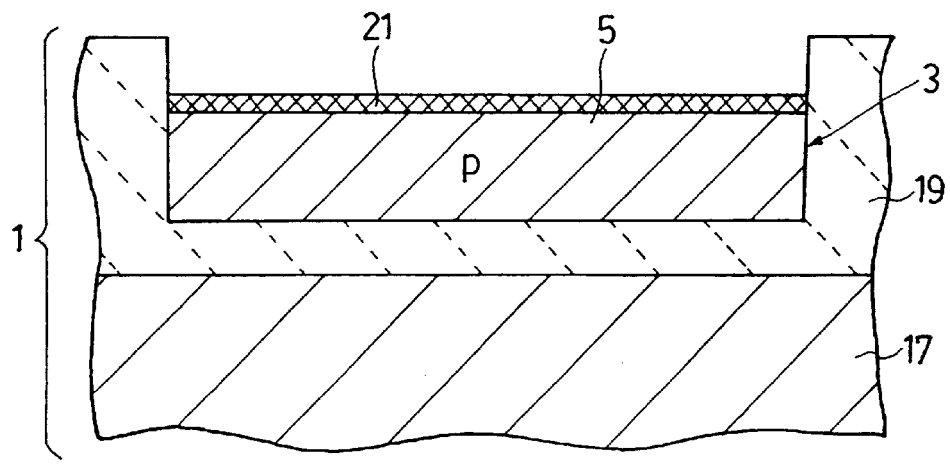
FIG. 30 to FIG. 41 are schematic sectional views, similar to FIG. 29, showing the steps in due order for explaining a method of fabricating the semiconductor device shown in FIG. 29.
Figure 31:
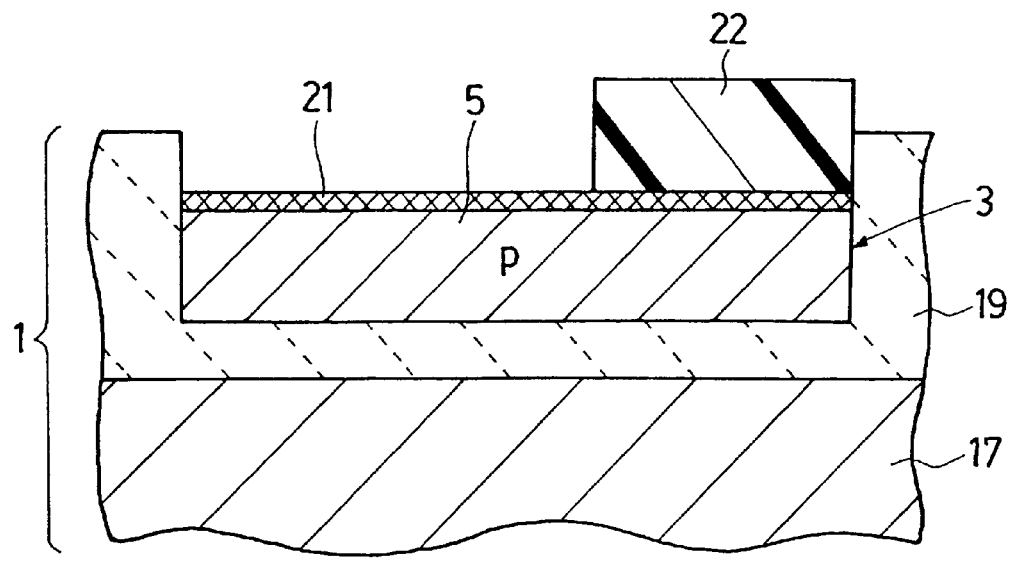
Figure 32:
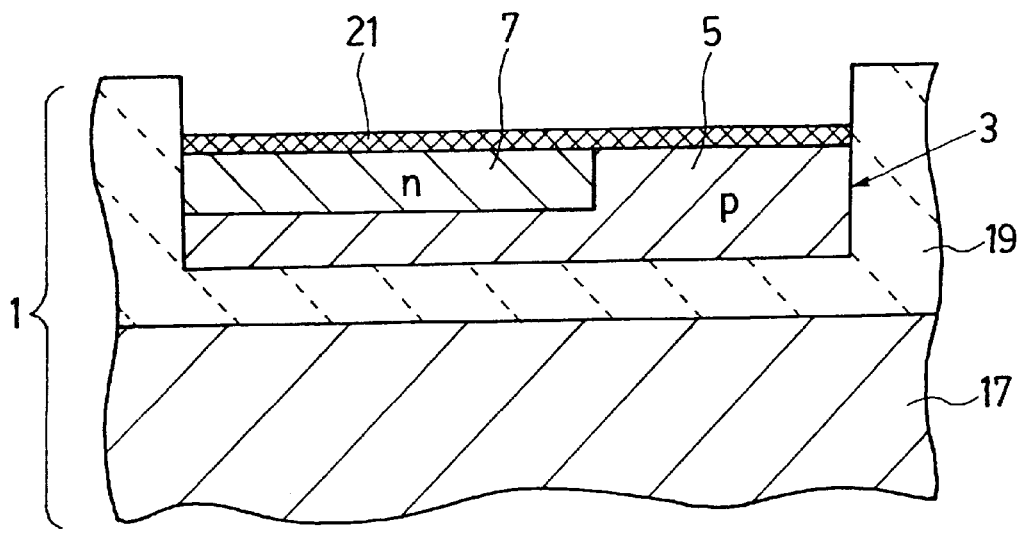
Figure 33:
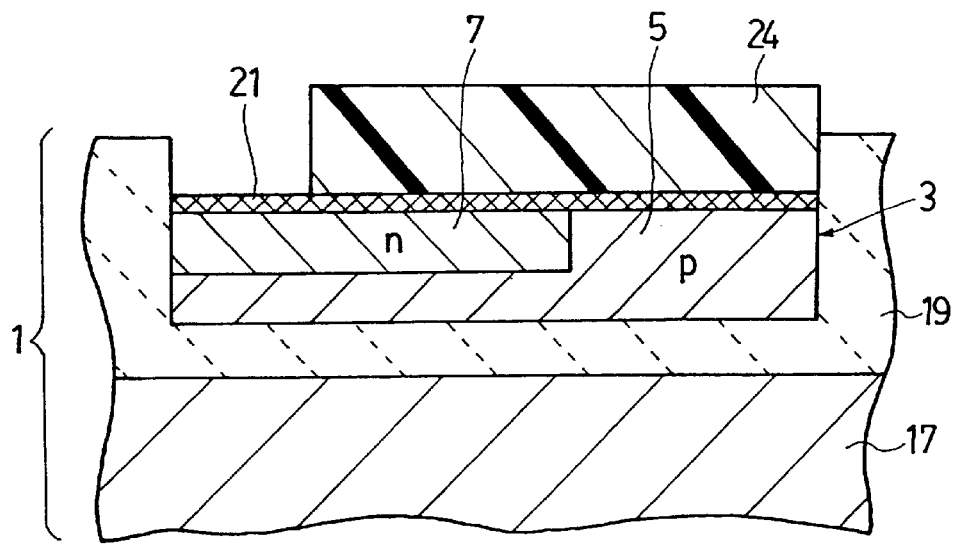
Figure 34:
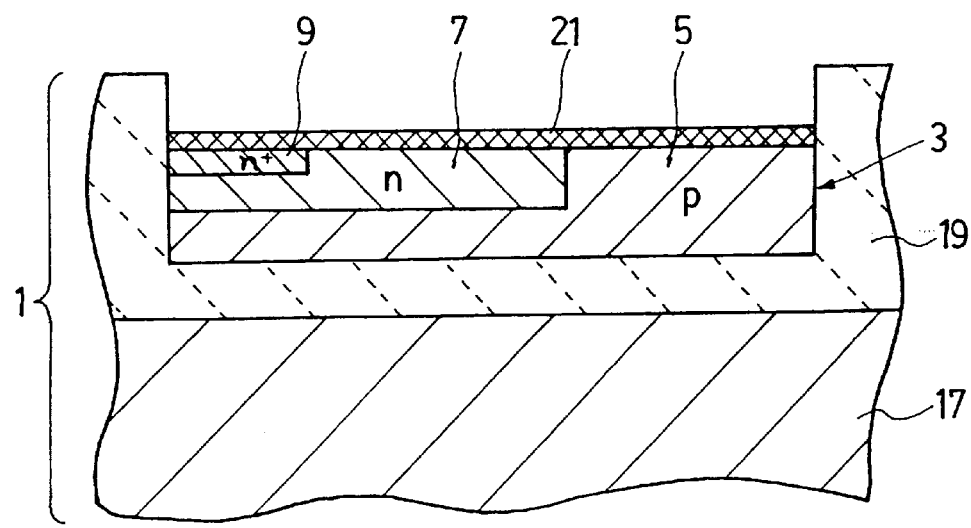
Figure 35:
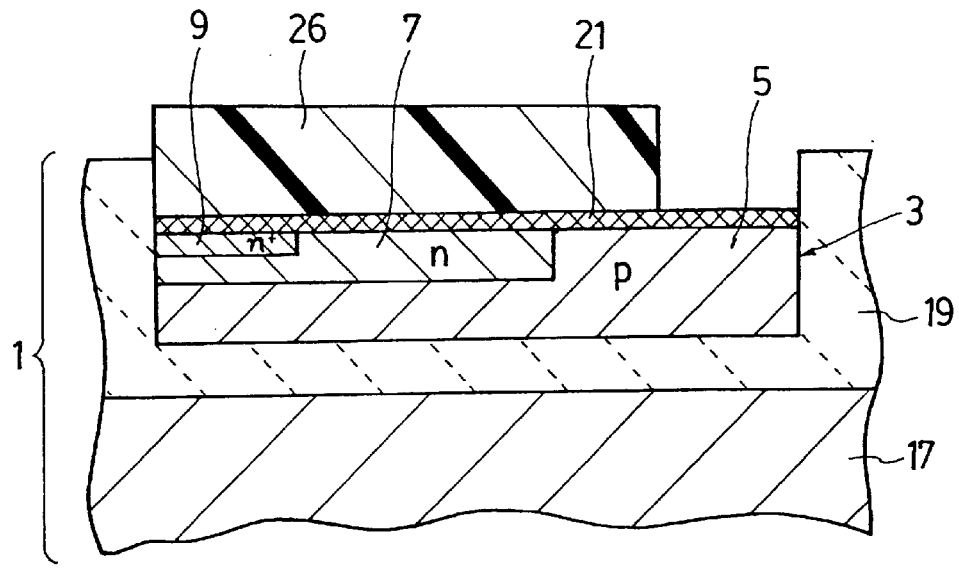
Figure 36:
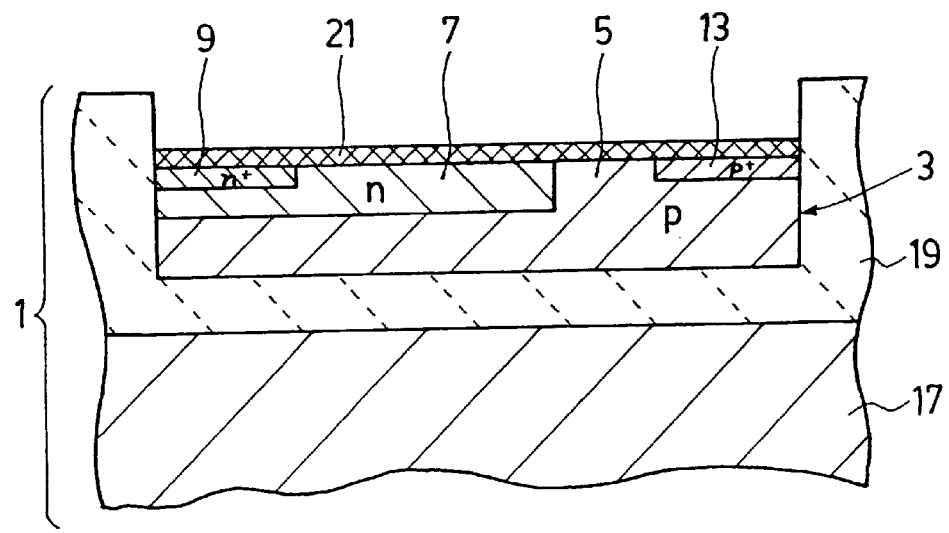
Figure 37:
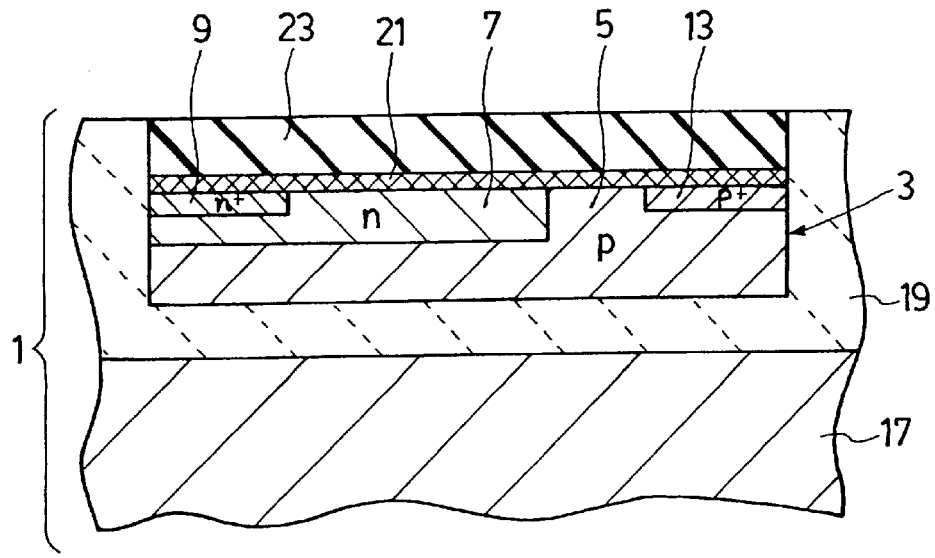
Figure 38:
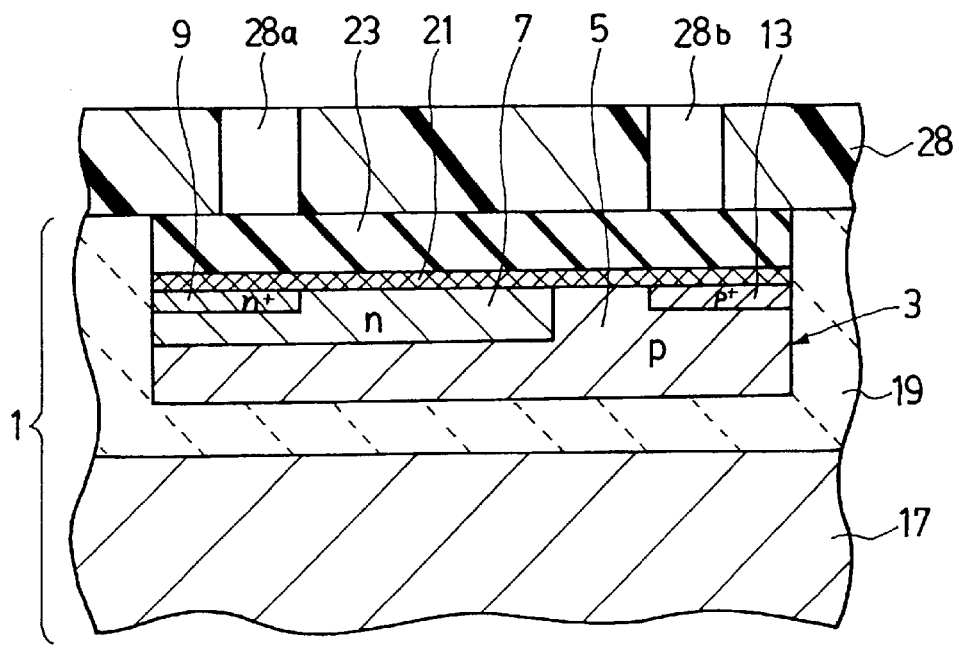
Figure 39:
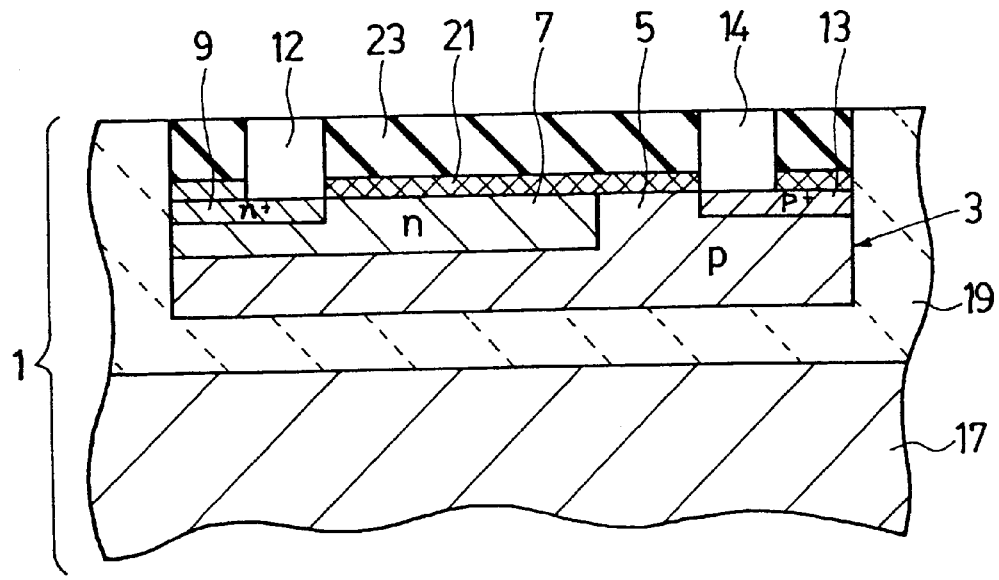
Figure 40:
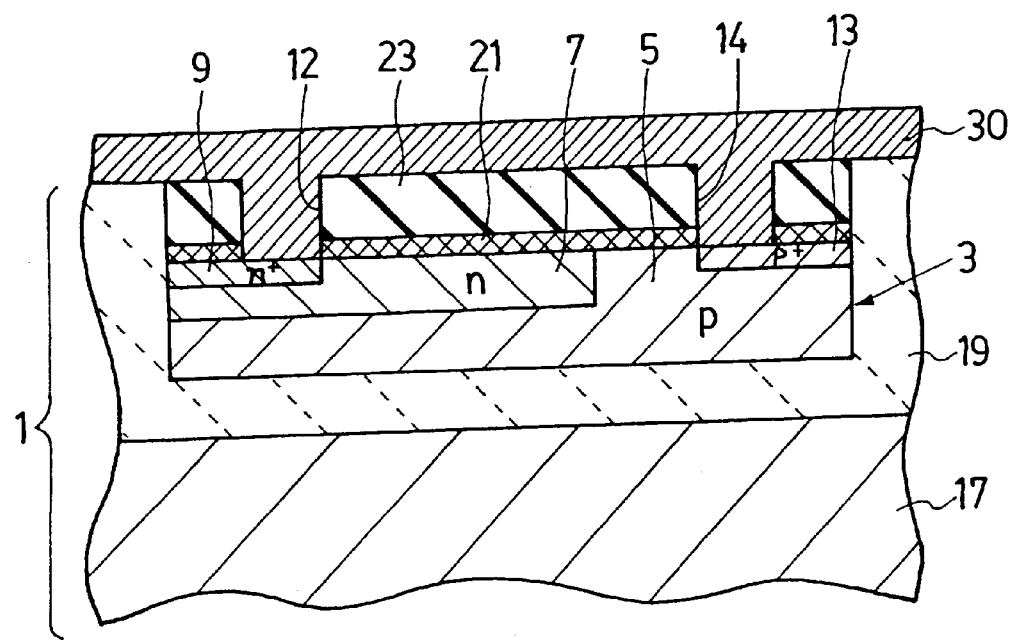
Figure 41:
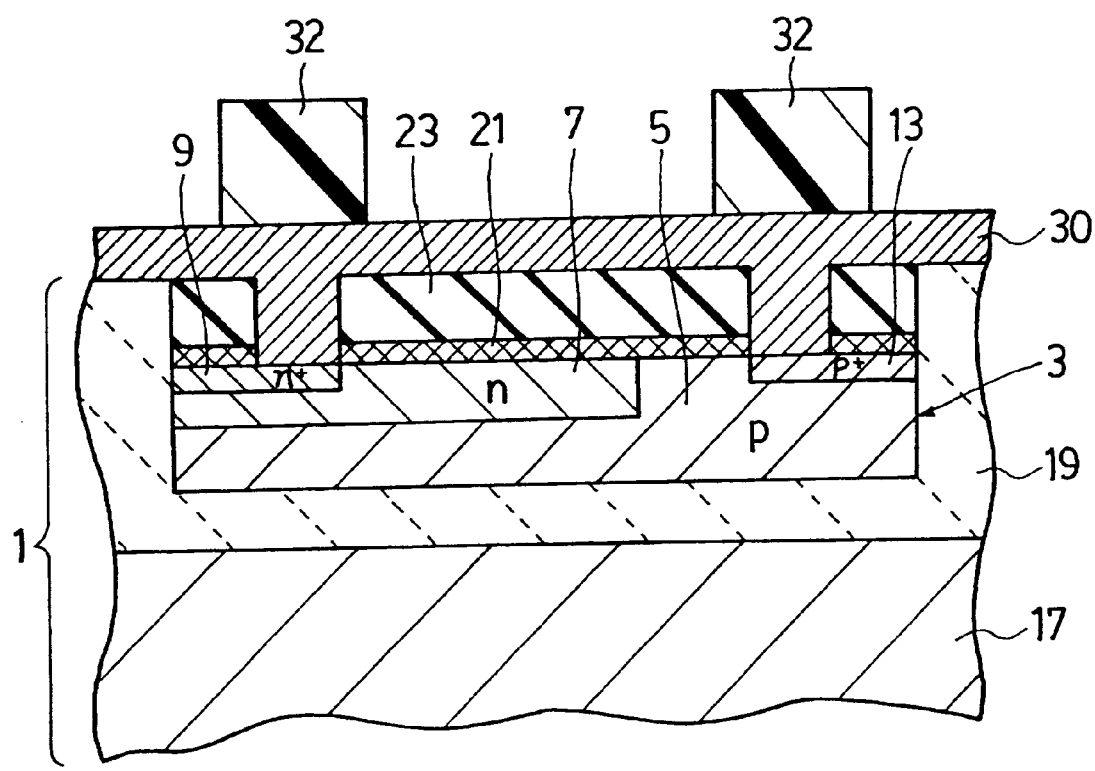

First, the first embodiment of a semiconductor device according to the present invention will be explained with reference to FIG. 1. FIG. 1 is a schematic sectional view showing a principal portion of the semiconductor device. More specifically, a portion in which a diode is formed in a surface silicon layer at the top of an SOI substrate is shown enlarged. In FIG. 1, the same numerals and symbols as those in FIG. 29 are given to portions corresponding to those of the aforesaid semiconductor device shown in FIG. 29.

In this semiconductor device, a diode 2 is formed in a surface silicon layer 3 of an SOI substrate 1. The SOI substrate 1 has a structure in which a buried oxide film 19 having a film thickness of the order of several $\mu$m is provided on a silicon substrate 17 having a thickness of the order of 600 $\mu$M which is a supporting substrate, and a plurality of surface silicon layers 3 are isolated from one another to be provided like islands on the buried oxide film 19. The film thickness of the surface silicon layer is of the order of 1 $\mu$m, and only one surface silicon layer in which the diode 2 is formed is shown in FIG. 1.

The diode 2 has a configuration in which a PN junction region 6 is formed inside the surface silicon layer 3 with a p region 5 which is formed on the buried oxide film 19 side (on the lower side in the drawing) of the surface silicon layer 3 and an n region 7 formed on the surface side (on the upper side in the drawing).

A lightly doped p region 33 is provided on one end side (on the left-hand side in the drawing) of the PN junction region 6, and a lightly doped n region 31 is provided on the other end side (on the right-hand side in the drawing).

A heavily doped n region 9 is provided at the surface portion in the lightly doped n region 31 in such a manner as not to contact the n region 7, and a heavily doped p region 13 is provided, similarly to above, at the surface portion in the lightly doped p region 33 in such a manner as not to contact the n region 7.

Boron atoms are used for impurities in the p region 5, the lightly doped p region 33, and the heavily doped p region 13. Phosphorus atoms are used for impurities in the n region 7, the lightly doped n region 31, and the heavily doped n region 9.

Furthermore, a silicon oxide film 21 is provided to cover the top face of the surface silicon layer 3, and an insulating film 23 is provided to cover the silicon oxide film 21. Contact holes 12 and 14 are respectively formed, at positions corresponding to the heavily doped p region 13 and the heavily doped n region 9, in the silicon oxide film 21 and the insulating film 23. From the outside through the respective contact holes 12 and 14, formed are a metal plate 11 contacting the heavily doped p region 13 and a metal plate 15 contacting the heavily doped n region 9.

The diode 2 has three types of PN junctions. The first one is the PN junction region 6 with the p region 5 and the n region 7, the second one is a PN junction with the lightly doped n region 31 and the p region 5, and the third one is a PN junction with the lightly doped p region 33 and the n region 7.

Of these three types of PN junctions, it is the PN junction region 6 that has the highest impurity concentrations in both contacting regions. As described hereinbefore, the higher the impurity concentrations are, the lower the junction breakdown voltage becomes in the PN junction. The two other PN junctions are high in junction breakdown voltage, since one of the contacting regions is a lightly doped region. Accordingly, the PN junction region 6 is the lowest in junction breakdown voltage, so that a breakdown occurs first in the diode 2.

However, the PN junction region 6 is formed inside the surface silicon layer 3, and so both ends thereof contact only the lightly doped p region 33 and the lightly doped n region 31 and not the silicon oxide film 21.

Accordingly, even when a breakdown occurs and then carriers which have gained high energy appear, the carriers are confined within the surface silicon layer 3 and so do not flow into the silicon oxide film 21, therefore the carriers are not captured in the silicon oxide film 21. Consequently, the diode 2 does not vary in device characteristics. When this diode 2 is used, a circuit with high accuracy can be constituted. The circuit can obtain sufficient performance without misoperation.

It is noted that the first conduction type is p type and the second conduction type is n type in the first embodiment, and vice-versa the first conduction type may be n type and the second conduction type may be p type.

First Embodiment of a Method of Fabricating the Semiconductor Device: FIG. 2 to FIG. 18

Next, as the first embodiment of a method of fabricating a semiconductor device according to the present invention, a method to fabricate the semiconductor device shown in FIG. 1 will be described hereinafter with reference to FIG. 2 through FIG. 18. FIG. 2 through FIG. 18 are sectional views, corresponding to FIG. 1, showing each of steps of the fabricating process of the semiconductor device.

Figure 2:
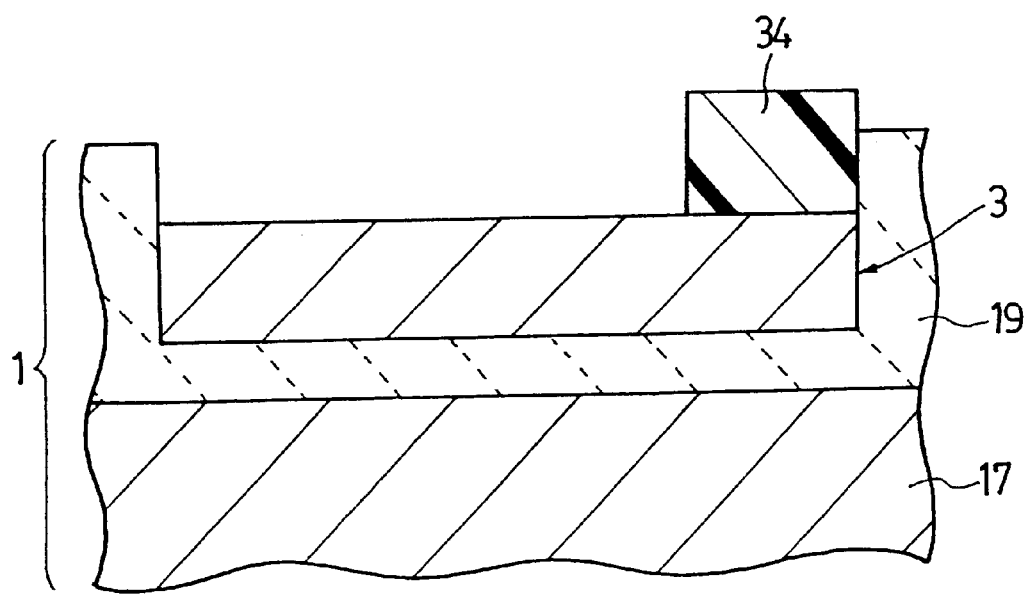

First, as shown in FIG. 2, the SOI substrate 1, in which a surface silicon layer 3 isolated by a buried oxide film 19 is provided like an island on a silicon substrate 17 which is a supporting substrate, is prepared. The conduction types of the silicon substrate 17 and the surface silicon layer 3 may be either the n type or the p type.

A photoresist 34 is formed on the whole surface of the SOI substrate 1 by spin coating and then is patterned, by exposing and developing with a predetermined photomask, in such a manner as to leave only on a portion which will be a lightly doped n region 31 of the surface silicon layer 3 shown in FIG. 1.

Figure 3:
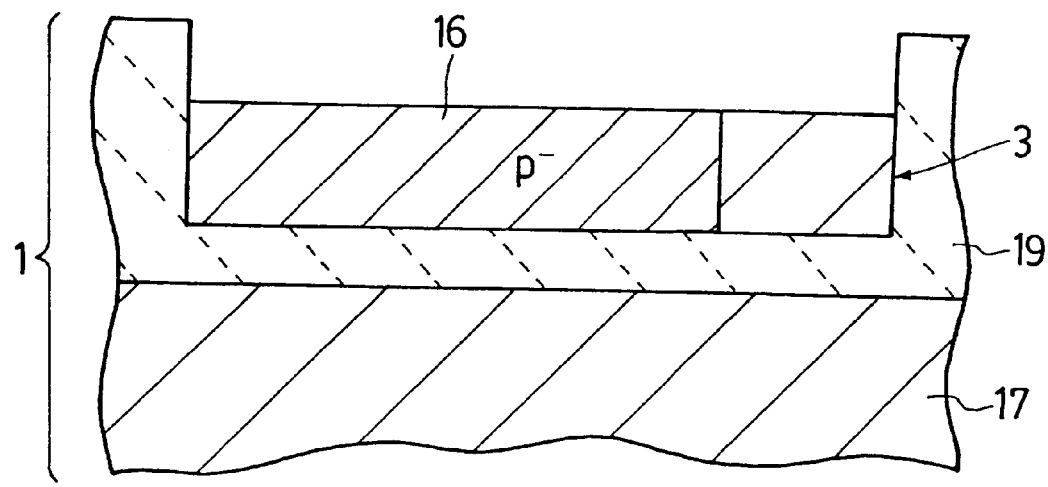

Next, using the photoresist 34 as an ion implantation barrier film, p impurities are ion-implanted under conditions of the order of 50 keV in implantation energy and $1\times10^{12}$ $cm^{-2}$ in implantation dose. As the p impurities, boron atoms are used. Thereafter, when the photoresist 34 is removed with sulfuric acid ($H_2SO_4$), a portion of the surface silicon layer 3 which is not masked with the photoresist 34 becomes a lightly doped p region 16 as shown in FIG. 3.

Figure 4:
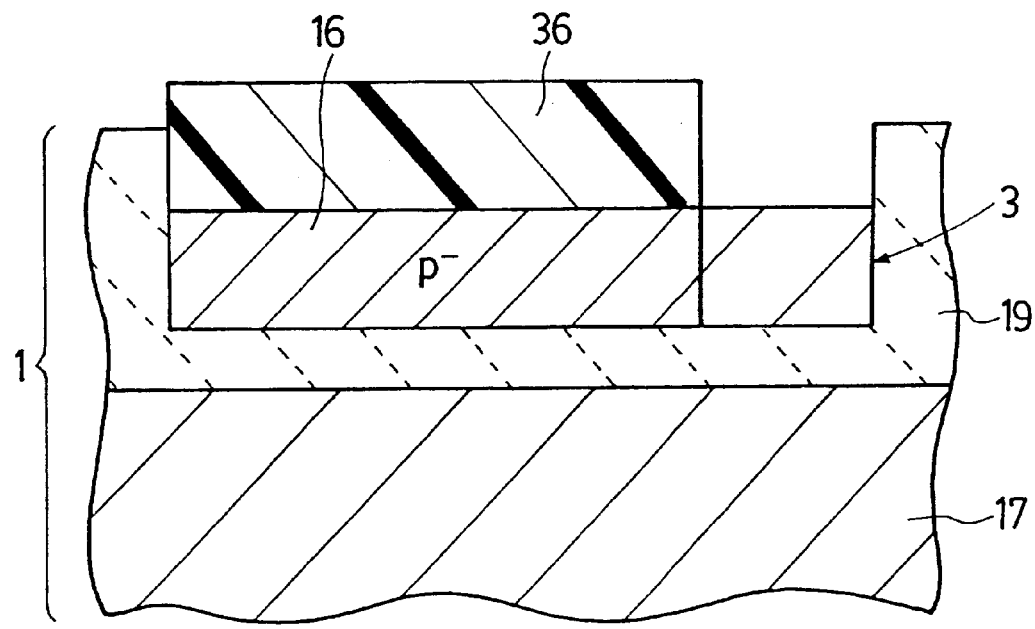

Sequentially, a photoresist 36 shown in FIG. 4 is formed on the whole surface of the SOI substrate 1 by spin coating and then is patterned, by exposing and developing with a predetermined photomask, in such a manner as to open a portion of the surface silicon layer 3 which becomes the lightly doped n region 31 shown in FIG. 1.

Figure 5:
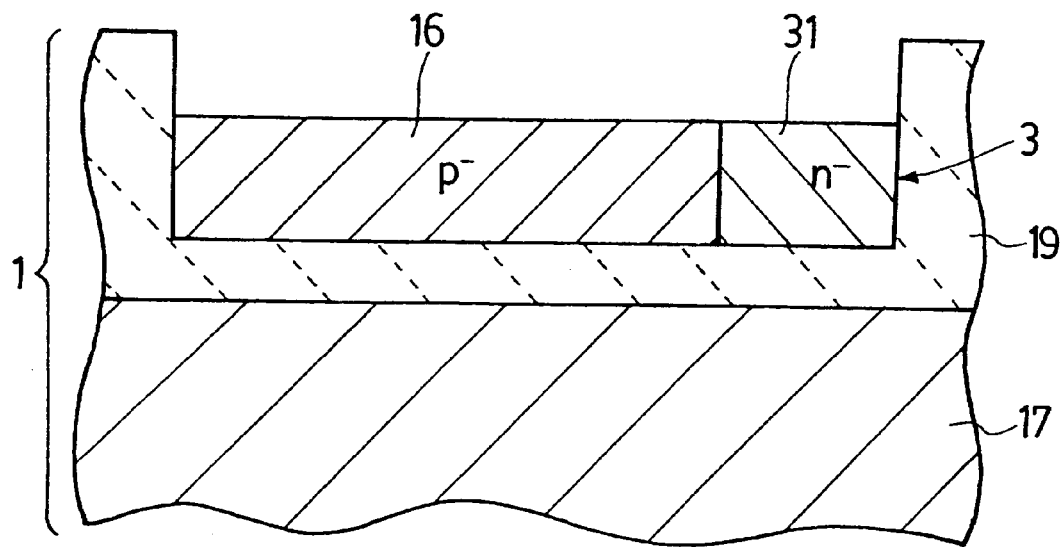

Next, using the photoresist 36 as an ion implantation barrier film, n impurities are ion-implanted under conditions of the order of 50 keV in implantation energy and $1\times10^{12}$ $cm^{-2}$ in implantation dose. As the n impurities, phosphorus atoms are used. Thereafter, when the photoresist 36 is removed with sulfuric acid, the lightly doped n region 31 is formed on the right end side in the drawing of the surface silicon layer 3 as shown in FIG. 5.

After that, by heat-treating at the tempering of 1000° C. for about 3 hours in a nitrogen atmosphere, the p impurities implanted in the lightly doped p region 16 and the n impurities implanted in the lightly doped n region 31 are diffused.

Figure 6:
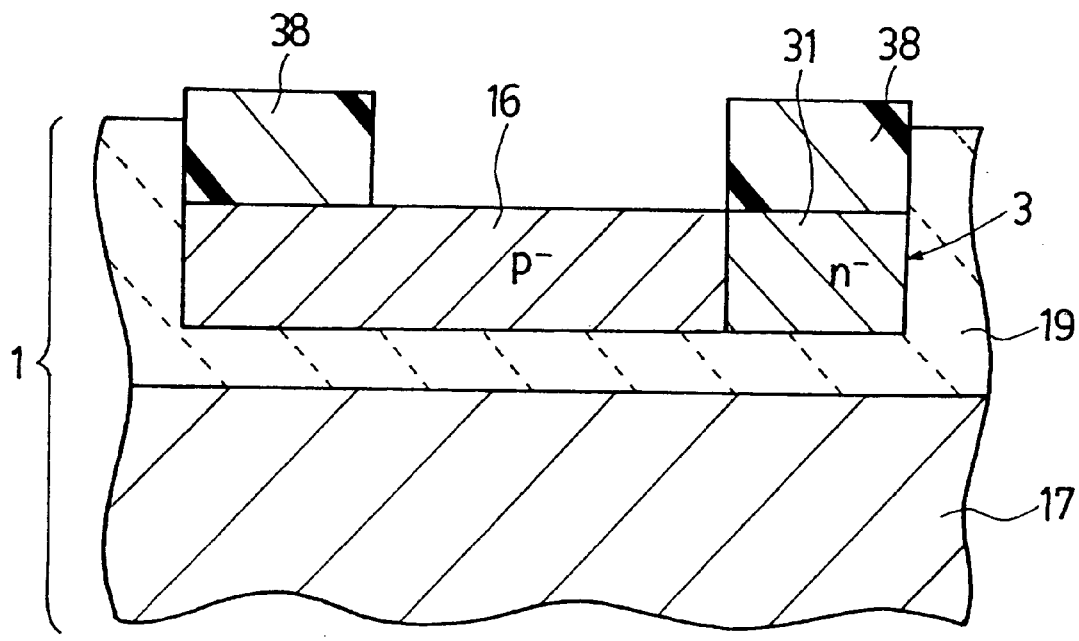

Next, a photoresist 38 shown in FIG. 6 is formed on the whole surface of the SOI substrate 1 by spin coating and then is patterned, by exposing and developing with a predetermined photomask, in such a manner as to open portions of the surface silicon layer 3 where the n region 7 and the p region 5 shown in FIG. 1 are formed.

Then, using the photoresist 38 as an ion implantation barrier film, p impurities are ion-implanted under conditions of the order of 50 keV in implantation energy and $6\times10^{12}$ $cm^{-2}$ in implantation dose. As the p impurities, boron atoms are again used. Thereby, a region that is not masked with the photoresist 38 of the surface silicon layer 3 becomes the p region 5 as shown in FIG. 7. A portion which is masked with the photoresist 38 (a portion on the left end side in the drawing) becomes the lightly doped p region 33 shown in FIG. 1.

Sequentially, using the photoresist 38 as an ion implantation barrier film, n impurities are ion-implanted under conditions of the order of 25 keV in implantation energy and $6\times10^{12}$ $cm^{-2}$ in implantation dose. As the n impurities, phosphorus atoms are used.

In this case, the implantation energy is set to be about half of that in the case where the p impurities are implanted, so as to form an ion implanted layer 40 with the n impurities on the p region 5 from its surface to a midpoint in the thickness direction as shown in FIG. 8. Thereafter, the photoresist 38 shown in FIG. 7 is removed with sulfuric acid, resulting in a state shown in FIG. 8.

Figure 9:
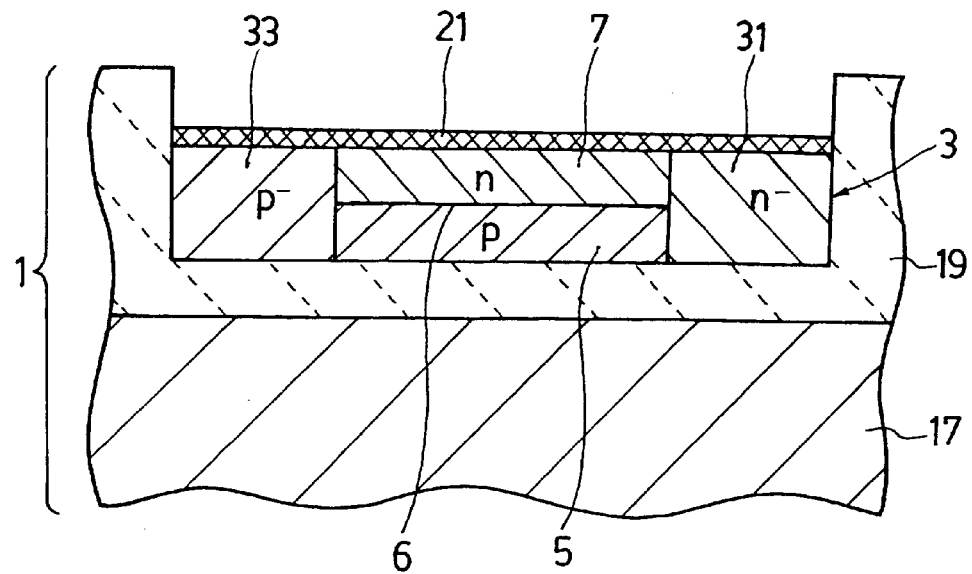

Next, by heat-treating at the temperature of 1100° C. for about 4 hours in a nitrogen atmosphere, which activates the p impurities and the n impurities which are implanted in the p region 5 and the ion implanted layer 40 with the n impurities, the p region 5 is formed and the n region 7 is formed thereon as shown in FIG. 9, both of which are connected to form the PN junction region 6.

Furthermore, by heat-treating at the temperature of 1000° C. for about 2 hours in an oxygen atmosphere, a silicon oxide film 21 having a film thickness of the order of 80 nm is formed in such a manner as to cover the whole surface of the surface silicon layer 3 as shown in FIG. 9.

Figure 10:
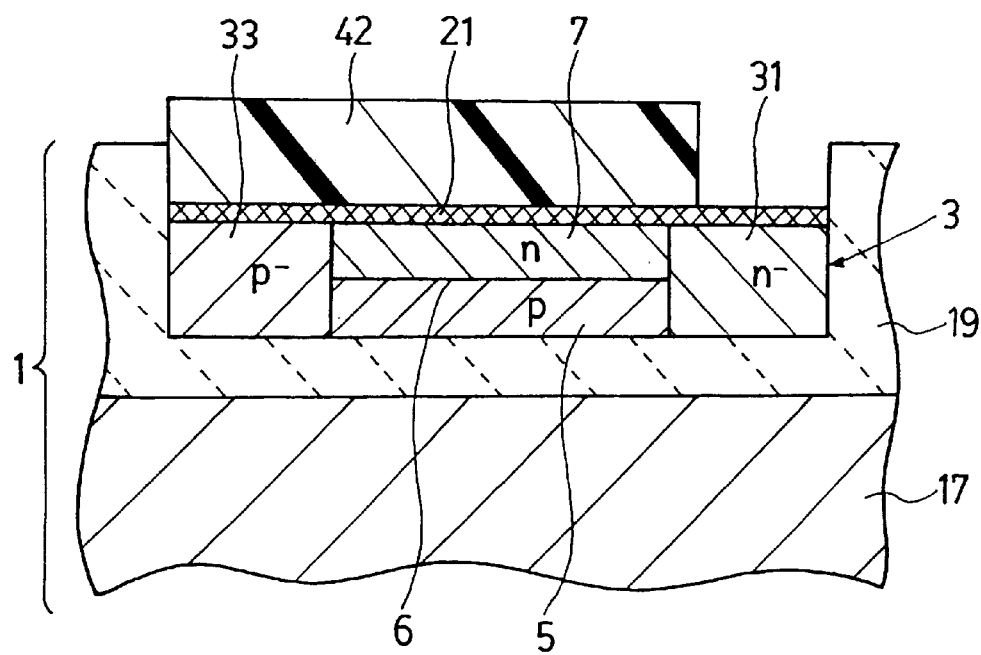

Next, a photoresist 42 shown in FIG. 10 is formed on the whole surface of the SOI substrate 1 by spin coating and then is patterned, by exposing and developing with a predetermined photomask, in such a manner as to open a region on the surface silicon layer 3 where the heavily doped n region 9 shown in FIG. 1 is formed.

Then, using the photoresist 42 as an ion implantation barrier film, n impurities are ion-implanted into the lightly doped n region 31 through the silicon oxide film 21 under conditions of the order of 50 keV in implantation energy and $5\times10^{15}$ cm$^{-2}$ in implantation dose. As the n impurities, phosphorus atoms are again used. Thereafter, the photoresist 42 is removed with sulfuric acid. Thereby, the heavily doped n region 9 is formed at the top of the lightly doped n region 31 in such a manner as not to contact the n region 7 as shown in FIG. 11.

Thereafter, a photoresist 44 shown in FIG. 12 is formed on the whole surface of the SOI substrate 1 by spin coating and then is patterned, by exposing and developing with a predetermined photomask, in such a manner as to expose a region on the surface silicon layer 3 where the heavily doped p region 13 shown in FIG. 1 is formed.

Figure 13:
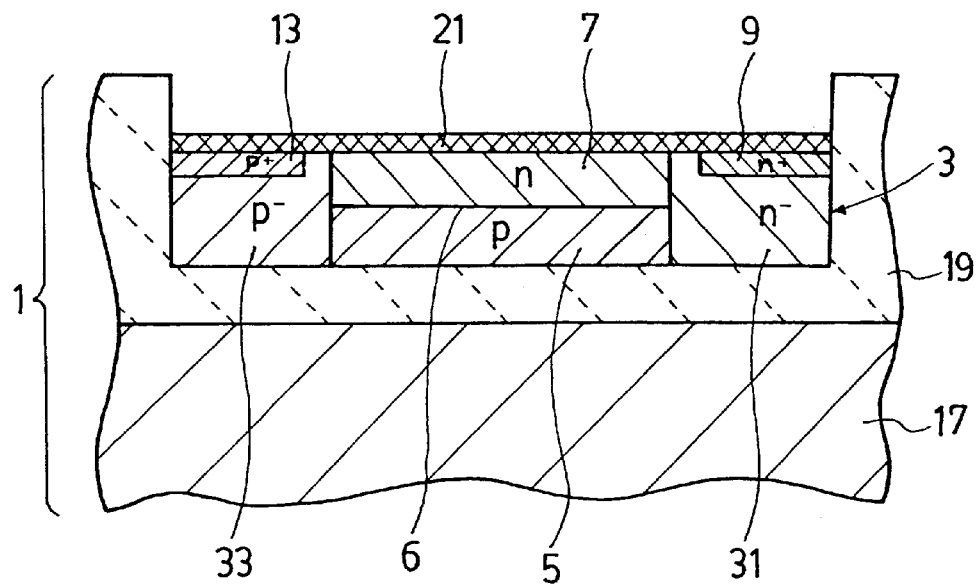

Then, using the photoresist 44 as an ion implantation barrier film, p impurities are ion-implanted under conditions of the order of 35 keV in implantation energy and $5\times10^{15}$ cm$^{-2}$ in implantation dose. As the p impurities, boron atoms are again used. Thereafter, the photoresist 44 is removed with sulfuric acid. Thereby, the heavily doped p region 13 is formed at the top of the lightly doped p region 33 in such a manner as not to contact the n region 7 as shown in FIG. 13.

Figure 14:
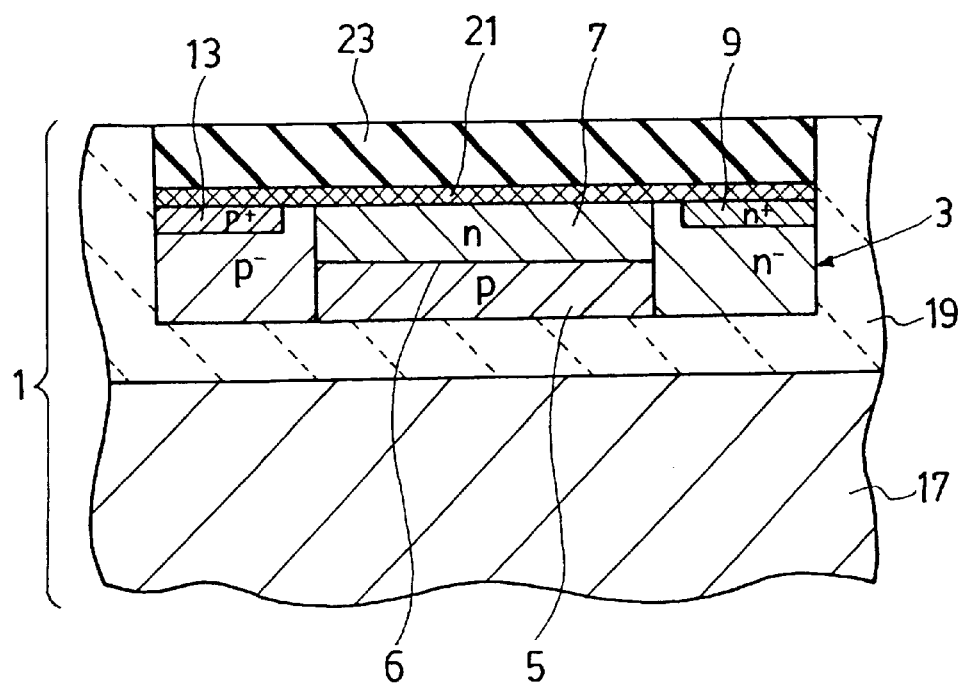

Next, the insulating film 23 is formed to cover the whole surface of the silicon oxide film 21 as shown in FIG. 14 by a CVD method in which monosilane ($SiH_4$), phosphine ($PH_3$) and diborane ($B_2H_6$) are used as reactive gasses. The insulating film 23 is a silicon oxide film including phosphorus and boron as impurities and is of the order of 0.5 $\mu$m in film thickness.

Thereafter, by heat-treating at the temperature of 900° C. for about 30 minutes in a nitrogen atmosphere, the p impurities and the n impurities which are respectively implanted in the heavily doped p region 13 and the heavily doped n region 9 are activated, allowing the surface of the insulating film 23 with unevenness to reflow so as to make it flat.

Figure 15:
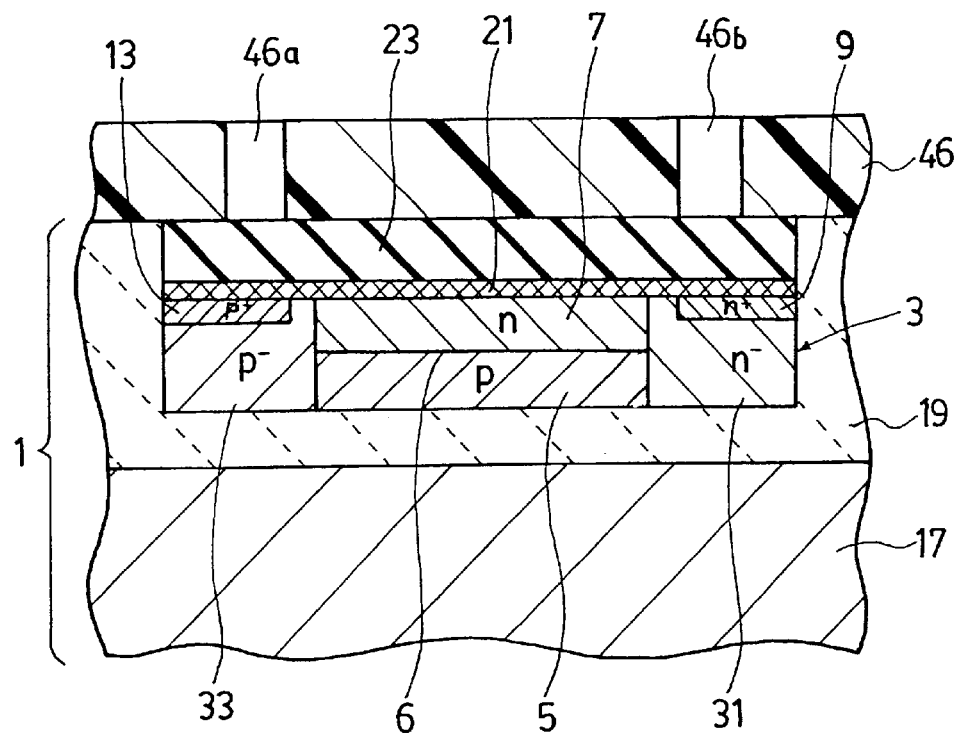

Sequentially, a photoresist 46 shown in FIG. 15 is formed on the whole surface of the SOI substrate 1 by spin coating and then is patterned, by exposing and developing with a predetermined photomask, in such a manner as to form openings 46a and 46b at locations corresponding thereto on the heavily doped p region 13 and the heavily doped n region 9.

Figure 16:
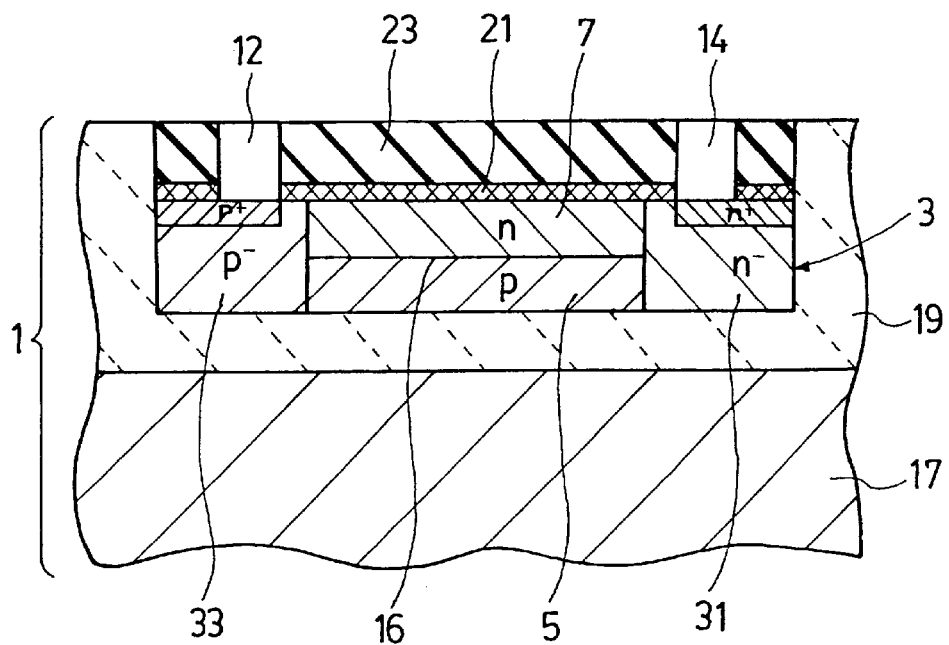

Then, the insulating film 23 and the silicon oxide film 21 under the openings 46a and 46b of the photoresist 46 are completely removed by reactive ion etching, using carbon tetrafluoride ($CF_4$), methane trifluoride ($CHF_3$) and helium (He) as reactive gasses, so as to form contact holes 12 and 14 as shown in FIG. 16. Thereafter, the photoresist 46 shown in FIG. 15 is removed with sulfuric acid.

Figure 17:
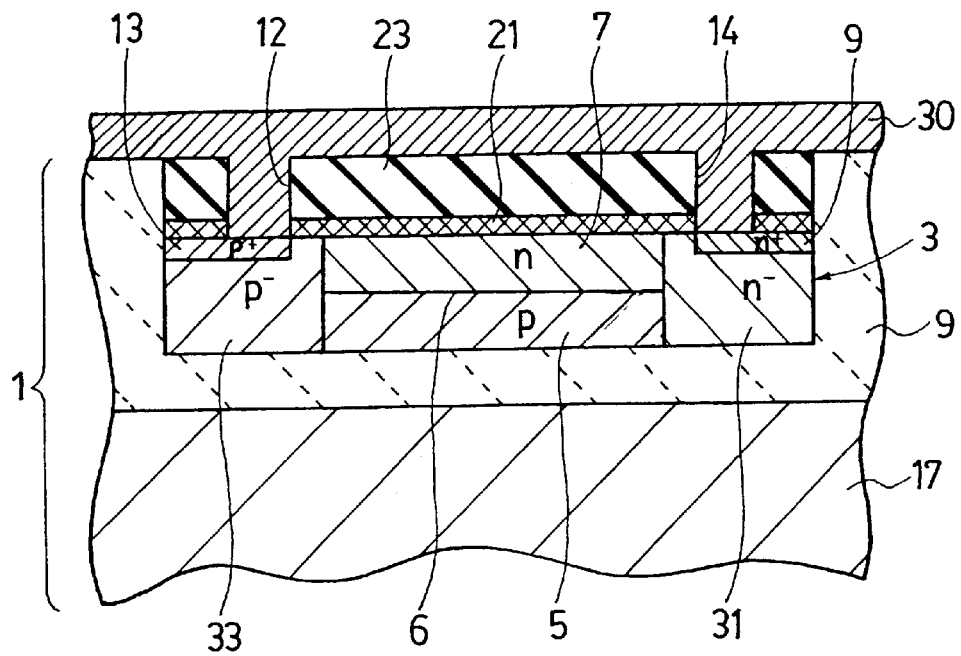

Sequentially, a film 30 of metal plate material is formed in the order of 1 $\mu$m in film thickness as shown in FIG. 17 on the whole surface of the SOI substrate 1 and in the contact holes 12 and 14 by spattering. As the metal plate material, aluminium is used.

Figure 18:
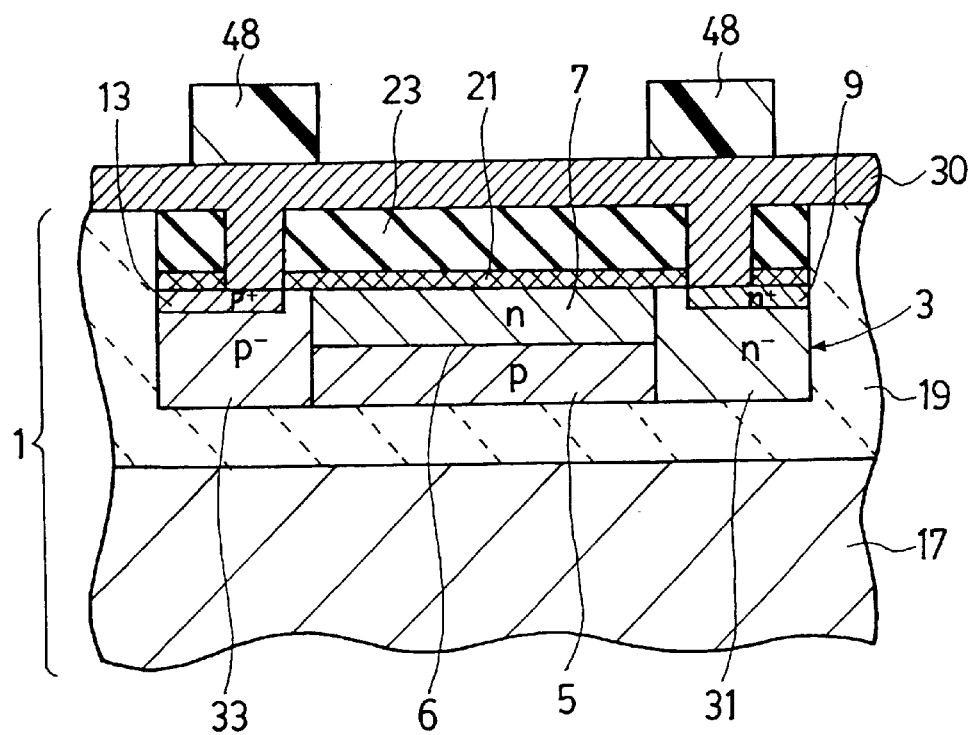

Next, a photoresist 48 shown in FIG. 18 is formed on the whole surface of the film 30 of the metal plate material by spin coating and then is patterned, by exposing and developing with a predetermined photomask, in such a manner as to expose a portion of the film 30 of the metal plate material except at regions which will become metal plates.

Then, using the photoresist 48 as an etching mask, the portion of the film 30 which is not masked with the photo-resist 48 is completely removed by reactive ion etching, using boron trichloride ($BCl_3$) and chlorine ($C_2$), so as to form the metal plates 11 and 15 shown in FIG. 1. Thereafter, the photoresist 48 is removed with nitric acid ($HNO_3$).

Thereby, as shown in FIG. 1, the semiconductor device in which the diode 2 is formed on the SOI substrate1 is completed.

It is noted that even when all of the above p types and n types are respectively exchanged with each other, a diode identical to the original can be formed.

By this fabricating method, the diode 2 in which the PN junction region 6 is confined inside the surface silicon layer 3 as shown in FIG. 1 can be easily formed. In the PN junction region 6, a breakdown occurs earliest of all, since the impurity concentrations of both connecting regions are higher than those in other PN junction regions and the junction breakdown voltage is the lowest of all. However, since the breakdown occurs inside the surface silicon layer 3, carriers generated by the breakdown are not injected into the silicon oxide film 21. Therefore, variations in device characteristics caused by the carriers in the silicon oxide film 21 do not appear.

Figure 19:
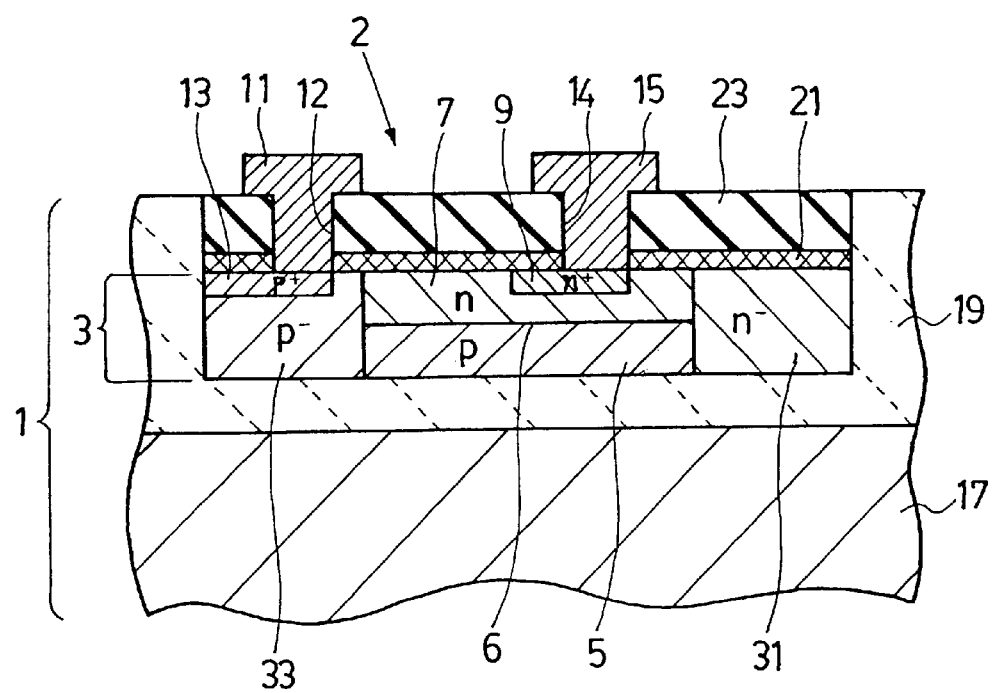
FIG. 19 is a schematic sectional view showing the structure of a principal portion of the second embodiment of a semiconductor device according to the present invention.

Second Embodiment of a Semiconductor Device: FIG. 19

Next, the second embodiment of a semiconductor device according to the present invention will be described with reference to FIG. 19. FIG. 19 is a schematic sectional view similar to FIG. 1 showing the structure of the semiconductor device, and the same numerals and symbols as those in FIG. 1 are given to the portions corresponding to those in FIG. 1.

This semiconductor device differs from the first embodiment of the semiconductor device as shown in FIG. 1 in the point that the heavily doped n region 9 of the diode 2 is formed not at the top of the lightly doped n region 31 but at the surface portion in the n region 7, and therewith locations of the contact hole 14 and the metal plate 15 are changed.

The other structures except the above are the same as those of the semiconductor device of the aforesaid first embodiment, and the description thereof will be omitted.

In this semiconductor device, in the diode 2, the PN junction region 6 having a PN junction in which the impurity concentration in both connecting regions is the highest and the junction breakdown voltage is the lowest, is also confined within the surface silicon layer 3, so that the same effects as those in the first embodiment can be obtained.

Second Embodiment of the Method of Fabricating the Semiconductor Device: FIG. 20 to FIG. 28

Next, as the second embodiment of the method of fabricating the semiconductor device according to the present invention, a method to fabricate the semiconductor device shown in FIG. 19 will be described hereinafter with reference to FIG. 20 through FIG. 28. FIG. 20 to FIG. 28 are sectional views, corresponding to FIG. 19, showing each of steps of the fabricating process of the semiconductor device.

In the fabricating method of the second embodiment, since the steps to the formation of the silicon oxide film 21 are the same as those explained with FIG. 2 to FIG. 9 in the aforesaid fabricating method of the first embodiment, the description thereof will be omitted.

Henceforth, the process steps, after the p region 5 and the n region 7 forming the PN junction region 6 are formed in the surface silicon layer 3 which is provided, being isolated by the buried oxide film 19 on the SOI substrate 1, and the lightly doped p region 33 and the lightly doped n region 31 are formed to sandwich the p region 5 and the n region 7 at both ends, and the silicon oxide film 21 is formed thereon as shown in FIG. 9, will be described.

Figure 20:
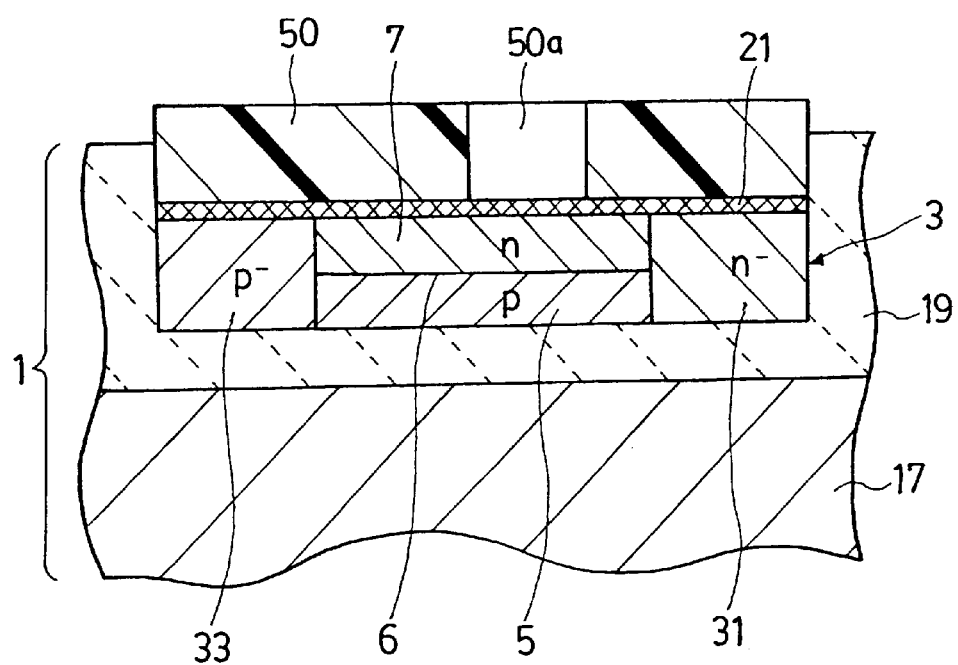
FIG. 20 to FIG. 28 are schematic sectional views, similar to FIG. 19, showing the steps in due order from partway for explaining a method of fabricating the semiconductor device shown in FIG. 19.

First, a photoresist 50 shown in FIG. 20 is formed on the whole surface of the SOI substrate 1 by spin coating and then is patterned, by exposing and developing with a predetermined photomask, in such a manner as to form an opening 50a at a portion over the n region 7 of the surface silicon layer 3.

Figure 21:
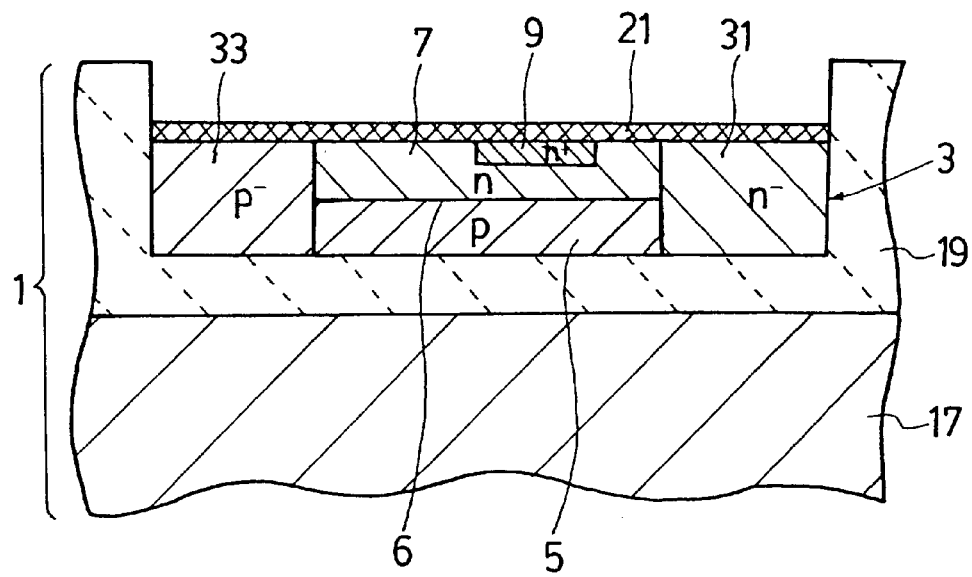

Then, using the photoresist 50 as an ion implantation barrier film, n impurities are ion-implanted into the portion of the n region 7 through the silicon oxide film 21 under conditions of the order of 50 keV in implantation energy and $5 \times 10^{15}$ cm$^{-2}$ in implantation dose. As the n impurities, phosphorus atoms are used. Thereby, the heavily doped n region 9 is formed at the top in the n region 7 as shown in FIG. 21. Thereafter, the photoresist 50 shown in FIG. 20 is removed with sulfuric acid.

Next, a photoresist 52 shown in FIG. 22 is formed again on the whole surface of the SOI substrate 1 by spin coating and then is patterned, by exposing and developing with a predetermined photomask, to expose a region of the lightly doped p region 33 where the heavily doped p region 13 shown in FIG. 19 is formed.

Then, using the photoresist 52 as an ion implantation barrier film, p impurities are ion-implanted into the lightly doped p region 33 through the silicon oxide film 21 under conditions of the order of 35 keV in implantation energy and $5 \times 10^{15}$ cm$^{-2}$ in implantation dose. As the p impurities, boron atoms are used.

Figure 22:
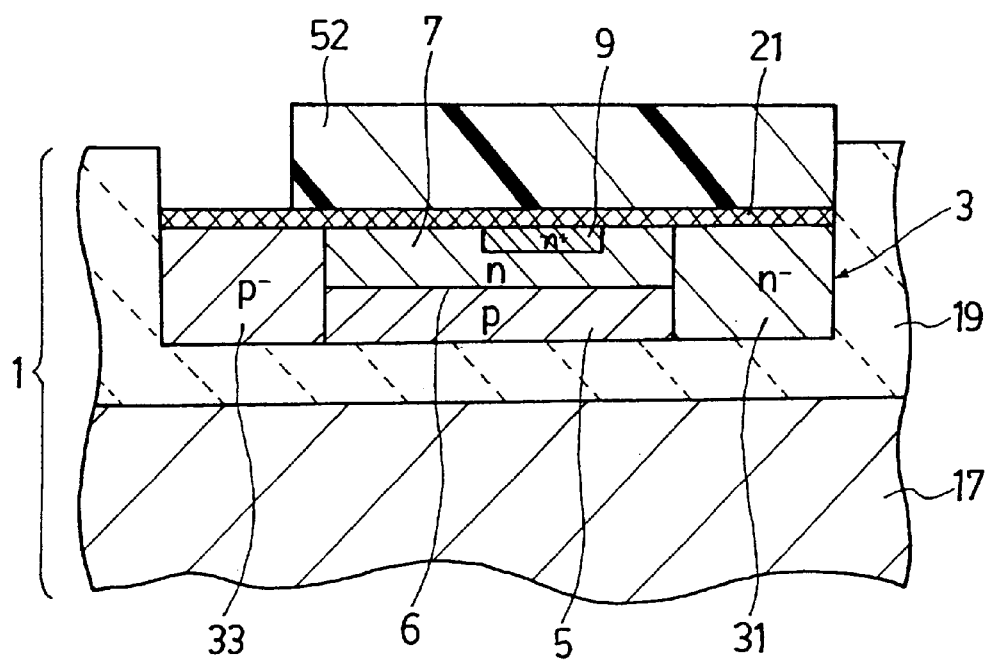
Figure 23:
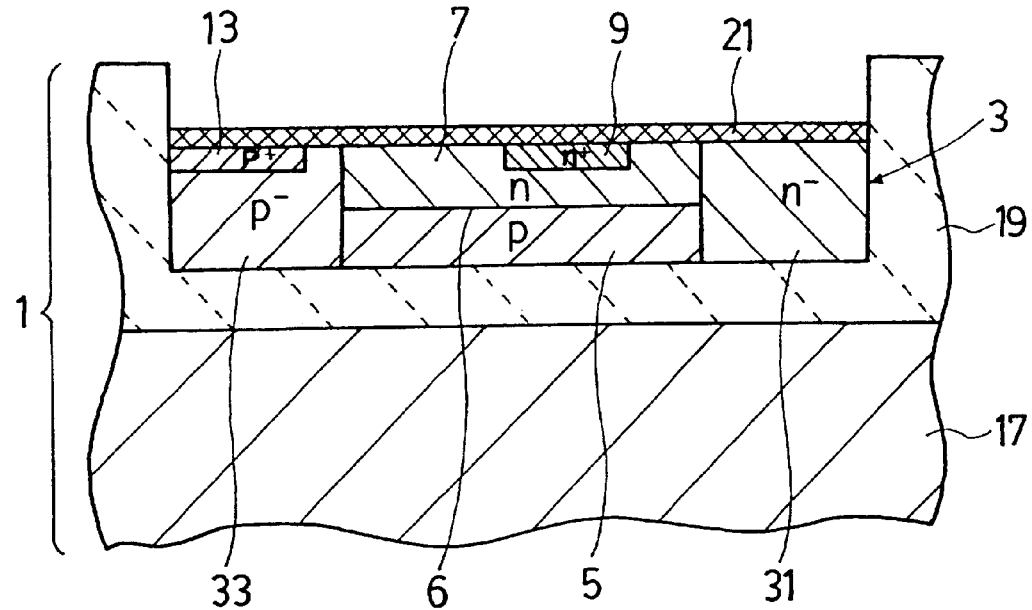

Thereby, the heavily doped p region 13 is formed at the top of the lightly doped p region 33 in such a manner as not to contact the n region 7 as shown in FIG. 23. Thereafter, the photoresist 52 shown in FIG. 22 is removed with sulfuric acid.

Figure 24:
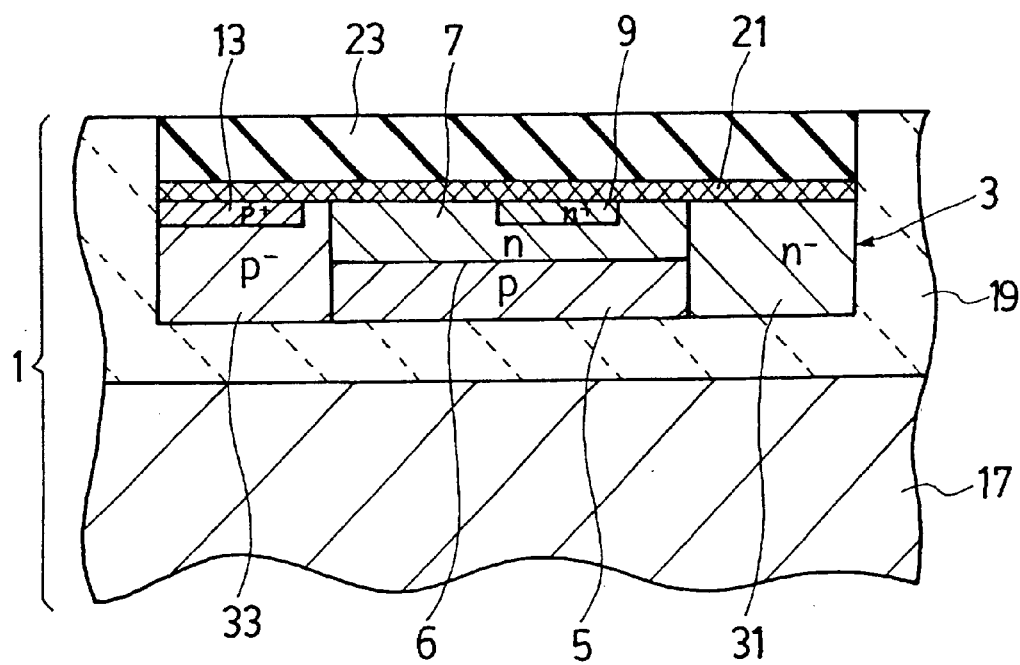

Next, the insulating film 23 is formed to cover the whole surface of the silicon oxide film 21 as shown in FIG. 24 and by heat-treating in a nitrogen atmosphere, which electrically activates the n impurities and the p impurities which are implanted in the heavily doped n region 9 and the heavily doped p region 13 respectively.

Figure 25:
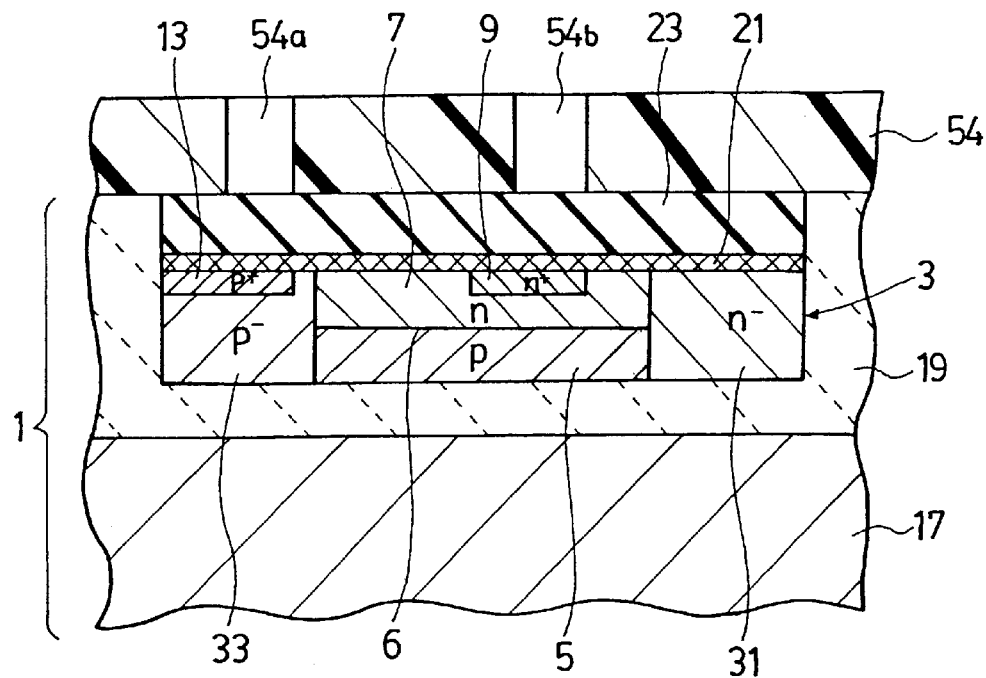

Thereafter, a photoresist 54 shown in FIG. 25 is formed on the whole surface of the SOI substrate 1 by spin coating and then is patterned, by exposing and developing with a predetermined photomask, in such a manner as to form openings 54a and 54b at locations corresponding thereto over the heavily doped p region 13 and the heavily doped n region 9.

Figure 26:
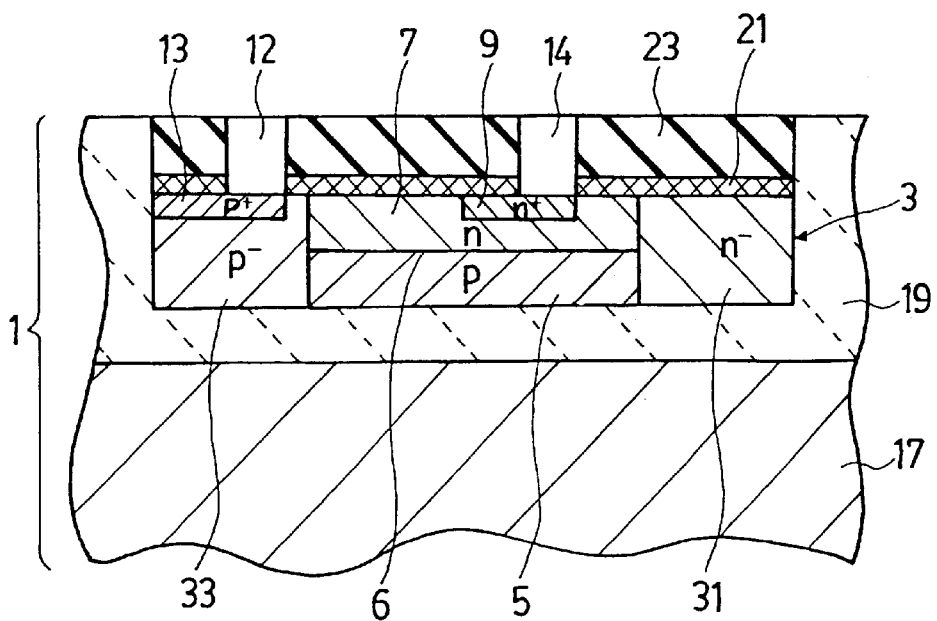

Then, using the photoresist 54 as an etching mask, the insulating film 23 and the silicon oxide film 21 under the openings 54a and 54b of the photoresist 54 are completely removed by reactive ion etching, similar to that in the first embodiment, so as to form the contact holes 12 and 14 as shown in FIG. 26. Thereafter, the photoresist 54 shown in FIG. 25 is removed with sulfuric acid.

Figure 27:
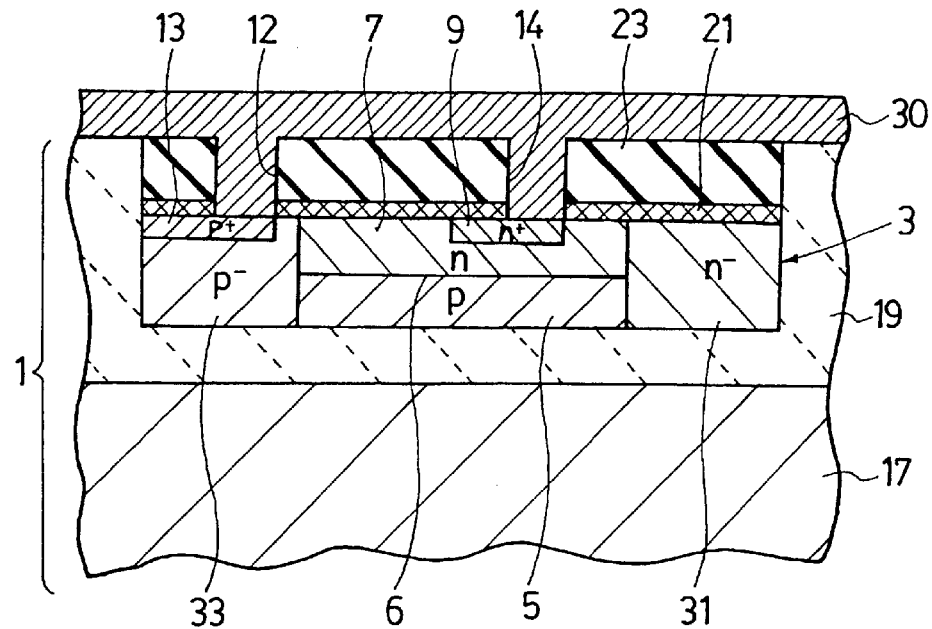

Sequentially, the film 30 of the metal plate material is formed on the whole surface of the SOI substrate 1 and in the contact holes 12 and 14 as shown in FIG. 27. As the metal plate material, aluminium is used.

Figure 28:
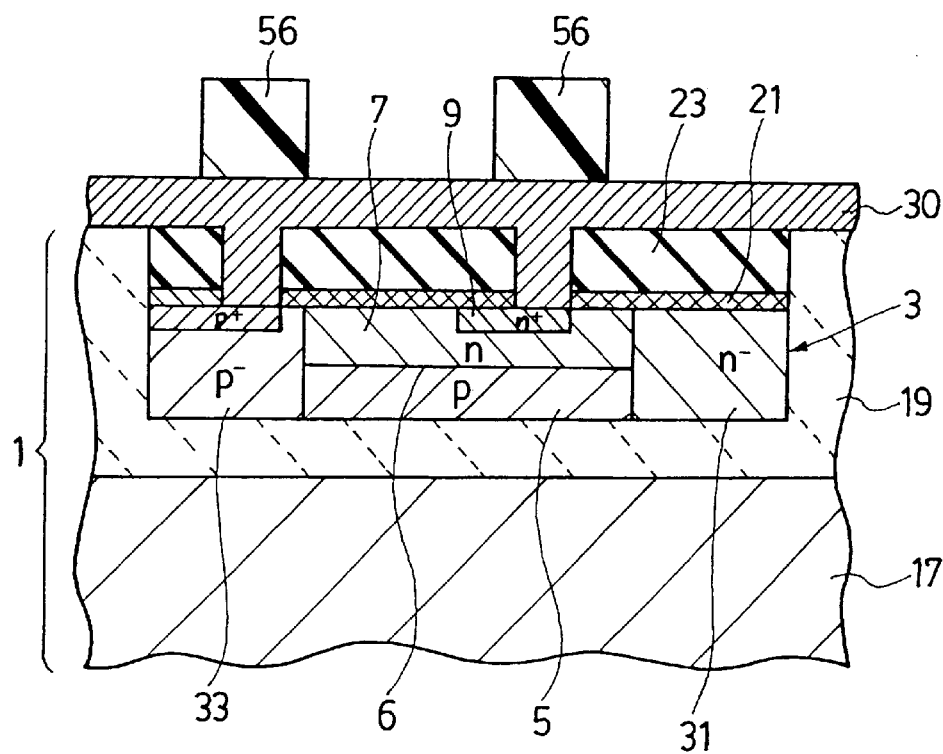

Next, a photoresist 56 shown in FIG. 28 is formed on the whole surface of the film 30 of the metal plate material by spin coating and then is patterned, by exposing and developing with a predetermined photomask, in such a manner to leave only on the regions where metal plates are formed.

Then, using the photoresist 56 as an etching mask, the film 30 except the portions masked with the photoresist 56 is completely removed by reactive ion etching, similar to that of the first embodiment, to form the metal plates 11 and 15 shown in FIG. 19. Thereafter, the photoresist 56 shown in FIG. 28 is removed with nitric acid (HNO$_3$).

Thereby, as shown in FIG. 19, the semiconductor device in which the diode 2 is formed on the SOI substrate 1 is completed.

It is noted that even when all of the above p types and n types are respectively exchanged with each other, a diode identical to the original can be formed.

Effects of the Invention

As has been described, the semiconductor device according to the present invention has a structure in which the PN junction region having the lowest junction breakdown voltage is confined inside the diode formed in the silicon surface layer on the SOI substrate, thus even when a breakdown occurs at the PN junction region by applying voltage to the diode, it is avoided that carriers caused by the breakdown are injected into the silicon oxide film 21 and captured therein. Therefore, variations in device characteristics caused by the carriers in the silicon oxide film do not appear, nor do changes in the junction breakdown voltage.

By the method of fabricating the semiconductor device according to the present invention, the semiconductor device according to the present invention can be easily manufactured.

What is claimed is:

1. A method of fabricating a semiconductor device, wherein a diode is formed in a surface silicon layer of an SOI substrate having a plurality of surface silicon layers isolated by a buried oxide film on a silicon substrate, the forming of said diode comprising the steps of:

forming a first conduction type lightly doped region by selectively ion-implanting first conduction type impurity atoms into one end side of said surface silicon layer of said SOI substrate;

forming a second conduction type lightly doped region by selectively ion-implanting second conduction type impurity atoms into an other end side of said surface silicon layer;

diffusing the impurity atoms in said first conduction type lightly doped region and said second conduction type lightly doped region by heat-treating;

forming a first conduction type region by selectively ion-implanting the first conduction type impurity atoms into said surface silicon layer between said first conduction type lightly doped region and said second conduction type lightly doped region;

forming a PN junction region by selectively ion-implanting the second conduction type impurity atoms into said first conduction type region to a midpoint thereof in the thickness direction and then heat-treating to provide a second conduction type region on said first conduction type region;

forming a silicon oxide film on the whole surface of said surface silicon layer by oxidizing in an oxidizing atmosphere;

forming a first conduction type heavily doped region by selectively ion-implanting the first conduction type impurity atoms into a portion of said first conduction type lightly doped region which does not contact said second conduction type region;

forming a second conduction type heavily doped region by selectively ion-implanting the second conduction type impurity atoms into a portion of said second conduction type lightly doped region which does not contact said second conduction type region;

forming contact holes respectively at locations corresponding to said first conduction type heavily doped region and said second conduction type heavily doped region by photo-etching after forming an insulating film on the whole surface of said surface silicon layer; and forming a metal plate contacting said first conduction type heavily doped region and a metal plate contacting said second conduction type heavily doped region through the respective contact holes.

2. A method of fabricating a semiconductor device, wherein a diode is formed in a surface silicon layer of an SOI substrate having a plurality of surface silicon layers isolated by a buried oxide film on a silicon substrate, the forming of said diode comprising the steps of:

forming a first conduction type lightly doped region by selectively ion-implanting first conduction type impurity atoms into one end side of said surface silicon layer of said SOI substrate;

forming a second conduction type lightly doped region by selectively ion-implanting second conduction type impurity atoms into an other end side of said surface silicon layer;

diffusing the impurity atoms in said first conduction type lightly doped region and said second conduction type lightly doped region by heat-treating;

forming a first conduction type region by selectively ion-implanting the first conduction type impurity atoms into said surface silicon layer between said first conduction type lightly doped region and said second conduction type lightly doped region;

forming a PN junction region by selectively ion-implanting the second conduction type impurity atoms into said first conduction type region to a midpoint thereof in the thickness direction and then heat-treating to provide a second conduction type region on said first conduction type region;

forming a silicon oxide film on the whole surface of said surface silicon layer by oxidizing in an oxidizing atmosphere;

forming a first conduction type heavily doped region by selectively ion-implanting the first conduction type impurity atoms into a portion of said first conduction type lightly doped region which does not contact said second conduction type region;

forming a second conduction type heavily doped region by selectively ion-implanting the second conduction type impurity atoms into a portion of said second conduction type region;

forming contact holes respectively at locations corresponding to said first conduction type heavily doped region and said second conduction type heavily doped region by photo-etching after forming an insulating film on the whole surface of said surface silicon layer; and forming a metal plate contacting said first conduction type heavily doped region and a metal plate contacting said second conduction type heavily doped region through the respective contact holes.

* * * * *